(12) United States Patent
Bessette et al.

(10) Patent No.: US 7,106,228 B2
(45) Date of Patent: Sep. 12, 2006

(54) METHOD AND SYSTEM FOR MULTI-RATE LATTICE VECTOR QUANTIZATION OF A SIGNAL

(75) Inventors: Bruno Bessette, Rock Forest (CA); Stéphane Ragot, Sherbrooke (CA); Jean-Pierre Adoul, Castelnau le Lez (FR)

(73) Assignee: VoiceAge Corporation, Quebec (CA)

( * ) Notice: Subject to any disclaimer, the term of this patent is extended or adjusted under 35 U.S.C. 154(b) by 64 days.

(21) Appl. No.: 10/515,550

(22) PCT Filed: May 30, 2003

(86) PCT No.: PCT/CA03/00829

§ 371 (c)(1),
(2), (4) Date: Jun. 6, 2005

(87) PCT Pub. No.: WO03/103151

PCT Pub. Date: Dec. 11, 2003

(65) Prior Publication Data

US 2005/0285764 A1    Dec. 29, 2005

(30) Foreign Application Priority Data

May 31, 2002    (CA)    .................................... 2388358

(51) Int. Cl.
*H03M 7/00*    (2006.01)
(52) U.S. Cl. ......................................... 341/106; 341/51
(58) Field of Classification Search ................. 341/51, 341/65, 106; 375/242, 254, 240.02, 240.11; 382/100, 160, 162, 238, 240, 253
See application file for complete search history.

(56) References Cited

U.S. PATENT DOCUMENTS

| | | | | |
|---|---|---|---|---|
| 5,371,544 A | * | 12/1994 | Jacquin et al. | 375/240.11 |
| 5,943,446 A | * | 8/1999 | Pulsipher et al. | 382/253 |
| 6,128,346 A | * | 10/2000 | Suarez et al. | 375/254 |
| 6,154,572 A | * | 11/2000 | Chaddha | 382/253 |
| 6,205,256 B1 | * | 3/2001 | Chaddha | 382/253 |
| 6,516,297 B1 | * | 2/2003 | Servetto et al. | 704/222 |
| 6,807,312 B1 | * | 10/2004 | Thomas et al. | 382/253 |

OTHER PUBLICATIONS

C. Lamblin and J.-P. Adoul. *Algorithme de quantification vectorielle sphérique à partir du réseau de Gosset d'ordre 8.* Ann Télécommun., vol. 43, No. 3-4, pp. 172-186, 1988. No month.

(Continued)

*Primary Examiner*—Linh V. Nguyen
(74) *Attorney, Agent, or Firm*—Kirkpatrick & Lockhart Nicholson Graham LLP

(57) ABSTRACT

The present invention relates to a method and system for multi-rate lattice vector quantization of a source vector x representing a frame from a source signal to be used, for example, in digital transmission and storage systems. The multi-rate lattice quantization encoding method comprises the steps of associating to x a lattice point y in a unbounded lattice Λ; verifying if y is included in a base codebook C derived from the lattice Λ; if it is the case then indexing y in C so as to yield quantization indices if not then extending the base codebook using, for example a Voronoi based extension method, yielding an extended codebook; associating to y a codevector c from the extended codebook, and indexing y in the extended codebook C. The extension technique allows to obtain higher bit rate codebooks from the base codebooks compared to quantization method and system from the prior art.

34 Claims, 19 Drawing Sheets

OTHER PUBLICATIONS

J.-P. Adoul. *La quantification vectorielle des signaux : approche algébrique.* Ann. Télécommun., vol. 41, No. 3-4, pp. 158-177, 1986. No month.

J.-M. Moureaux, P. Loyer and M. Antonini. *Low-Complexity Indexing Method for Zn and Dn Lattice Quantizers.* IEEE Trans. Communications, vol. 46, No. 12, Dec. 1998.

P. Rault and C. Guillemot. *Indexing Algorithms for Zn, An, Dn, and Dn++ Lattice Vector Quantizers.* IEEE Transactions on Multimedia, vol. 3, No. 4, pp. 395-404, Dec. 2001.

P. Rault and C. Guillemot. *Lattice Vector Quantization with Reduced or Without Look-Up Table.* In Proc. SPIE Electronic Imaging, Santa Clara, FL, USA, Jan. 1998.

J. H. Conway and N. J. A. Sloane. *A Fast Encoding Method for Lattice Codes and Quantizers.* IEEE Trans. Inform. Theory, vol. IT-29, No. 6, pp. 820-824, Nov. 1983.

J. H. Conway and N. J. A. Sloane. *Fast Quantizing and Decoding Algorithms for Lattice Quantizers and Codes.* IEEE Trans. Inform. Theory, vol. IT-128, pp. 227-232, 1982. No month.

A. Gersho and R. M. Gray. *Vector Quantization and Signal Compression.* Kluwer Academic Publishers, 1992. No month.

D. Mukherjee and S. K. Mitra. *Vector Set-Partitioning with Successive Refinement Voronoi Lattice VQ for Enmbedded Wavelet Image Coding.* Proc. ICIP, Part 1, Chicago, IL, Oct. 1998, pp. 107-111.

G. D. Forney and L.-F. Wei. *Multidimensional Constellation—Part 1 : Introduction, Figures of Merit, and Generalized Cross Constellation.* IEEE J. Select. Areas Com., vol. SAC-7, No. 6, pp. 877-892, Aug. 1989.

M. Xie and J. P. Adoul. *Embedded Algebraic Vector Quantizers (EAVQ) with Application to Wideband Speech Coding.* [Reference], pp. 240-243, Mar. 1996.

C. Hahm and J. Kim. *Overload Vector Quantisation by Selective Shell Projection in Lattice VQ.* Electronics Letters, vol. 32, No. 24, [Pages], Nov. 1996.

Y. Zhang, Y. Yu and L. M. Po. *An Improvement Image Vector Quantization Based on Affine Transformation.* [Reference], pp. 1094-1099, Jan. 1997.

\* cited by examiner

| $j$ |
|---|

$NR$ bits = $4n$ bits

FIG. 19A 8-dimensional Voronoi index vector $k$

| $j$ | $k_1$ | $k_2$ | $k_3$ | $k_4$ | $k_5$ | $k_6$ | $k_7$ | $k_8$ |
|---|---|---|---|---|---|---|---|---|

$r$ bits $r$ bits ... $r$ bits $NR$ bits = 12 bits if $n$ is odd      $8r$ bits
$NR$ bits = 16 bits if $n$ is even

FIG. 19B

METHOD AND SYSTEM FOR MULTI-RATE LATTICE VECTOR QUANTIZATION OF A SIGNAL

CROSS-REFERENCE TO RELATED APPLICATIONS

This application is the national phase of International (PCT) Patent Application Serial No. PCT/CA03/00829, filed May 30, 2003, published under PCT Article 21(2) in English, which claims priority to and the benefit of Canadian Patent Application No. 2,388,358, filed May 31, 2002, the disclosures of which are incorporated herein by reference.

FIELD OF THE INVENTION

The present invention relates to encoding and decoding of signals. More specifically, the present invention is concerned with a method and system for multi-rate lattice vector quantization of a signal to be used, for example, in digital transmission and storage systems.

BACKGROUND OF THE INVENTION

A classical prior-art technique for the coding of digital speech and audio signals is transform coding, whereby the signal to be encoded is divided in blocks of samples called frames, and where each frame is processed by a linear orthogonal transform, e.g. the discrete Fourier transform or the discrete cosine transform, to yield transform coefficients, which are then quantized.

FIG. 1 of the appended drawings shows a high-level framework for transform coding. In this framework, a transform T is applied in an encoder to an input frame giving transform coefficients. The transform coefficients are quantized with a quantizer Q to obtain an index or a set of indices for characterizing the quantized transform coefficients of the frame. The indices are in general encoded into binary codes which can be either stored in a binary form in a storage medium or transmitted over a communication channel. In a decoder, the binary codes received from the communication channel or retrieved from the storage medium are used to reconstruct the quantized transform coefficients with a decoder of the quantizer $Q^{-1}$. The inverse transform $T^{-1}$ is then applied to these quantized transform coefficients for reconstructing the synthesized frame.

In vector quantization (VQ), several samples or coefficients are blocked together in vectors, and each vector is approximated (quantized) with one entry of a codebook. The entry selected to quantize the input vector is typically the nearest neighbor in the codebook according to a distance criterion. Adding more entries in a codebook increases the bit rate and complexity but reduces the average distortion. The codebook entries are referred to as codevectors.

To adapt to the changing characteristics of a source, adaptive bit allocation is normally used. With adaptive bit allocation, different codebook sizes may be used to quantize a source vector. In transform coding, the number of bits allocated to a source vector typically depends on the energy of the vector relative to other vectors within the same frame, subject to a maximum number of available bits to quantize all the coefficients. FIGS. 2a and 2b detail the quantization blocks of the FIG. 1 in the general context of a multi-rate quantizer. This multi-rate quantizer uses several codebooks typically having different bit rates to quantize a source vector x. This source vector is typically obtained by applying a transform to the signal and taking all or a subset of the transform coefficients.

FIG. 2($a$) depicts an encoder of the multi-rate quantizer, denoted by Q, that selects a codebook number n and a codevector index i to characterize a quantized representation y for the source vector x. The codebook number n specifies the codebook selected by the encoder while the index i identifies the selected codevector in this particular codebook. In general, an appropriate lossless coding technique can be applied to n and i in blocks $E_n$ and $E_i$, respectively, to reduce the average bit rate of the coded codebook number $n_E$ and index $i_E$ prior to multiplexing (MUX) them for storage or transmission over a communication channel.

FIG. 2($b$) shows decoding operations of the multi-rate quantizer. First, the binary codes $n_E$ and $i_E$ are demultiplexed (DEMUX) and their lossless codes are decoded in blocks $D_n$ and $D_i$, respectively. The retrieved codebook number n and index i are conducted to the decoder of the multi-rate quantizer, denoted by Q−1, that uses them to recover the quantized representation y of the source vector x. Different values of n usually result in different bit allocations, and equivalently different bit rates, for the index i. The codebook bit rate given in bits per dimension is defined as the ratio between the number of bits allocated to a source vector and the dimension of the source vector.

The codebook can be constructed using several approaches. A popular approach is to apply a training algorithm (e.g. the k-means algorithm) to optimize the codebook entries according to the source distribution. This approach yields an unstructured codebook, which typically has to be stored and searched exhaustively for each source vector to quantize. The limitations of this approach are thus its memory requirements and computational complexity, which increase exponentially with the codebook bit rate. These limitations are even amplified if a multi-rate quantization scheme is based on unstructured codebooks, because in general a specific codebook is used for each possible bit allocation.

An alternative is to use constrained or structured codebooks, which reduce the search complexity and in many cases the storage requirements.

Two instances of structured vector quantization will now be discussed in more detail: multi-stage and lattice vector quantization.

In multi-stage vector quantization, a source vector x is quantized with a first-stage codebook $C_1$ into a codevector $y_1$. To reduce the quantization error, the residual error $e_1 = x - y_1$ of the first stage, which is the difference between the input vector x and the selected first-stage codevector $y_1$, is then quantized with a second-stage codebook $C_2$ into a codevector y2. This process may be iterated with subsequent stages up to the final stage, where the residual error $e_{n-1} = x - y_{n-1}$ of the (n−1)th stage is quantized with an nth stage codebook $C_n$ into a codevector $y_n$.

When n stages are used (n≧2), the reconstruction can then be written as a sum of the codevectors $y = y_1 + \ldots + y_n$, where $y_l$ is an entry of the lth stage codebook $C_l$ for $l=1, \ldots, n$. The overall bit rate is the sum of the bit rates of all n codebooks.

In lattice vector quantization, also termed lattice VQ or algebraic VQ for short, the codebook is formed by selecting a subset of lattice points in a given lattice.

A lattice is a linear structure in N dimensions where all points or vectors can be obtained by integer combinations of N basis vectors, that is, as a weighted sum of basis vectors with signed integer weights. FIG. 3 shows an example in two dimensions, where the basis vectors are $v_1$ and $v_2$. The lattice used in this example is well-known as the hexagonal lattice denoted by $A_2$. All points marked with crosses in this figure can be obtained as $$y = k_1 v_1 + k_2 v_2 \quad (Eq.\ 1)$$

where y is a lattice point, and $k_1$ and $k_2$ can be any integers. Note that FIG. 3 shows only a subset of the lattice, since the lattice itself extends to infinity. We can also write Eq. 1 in matrix form $$y = [y_1 \ y_2] = [k_1 \ k_2] \begin{bmatrix} v_1 \\ v_2 \end{bmatrix} = [k_1 \ k_2] \begin{bmatrix} v_{11} & v_{12} \\ v_{21} & v_{22} \end{bmatrix} \quad (Eq.\ 2)$$

where the basis vectors $v_1 = [v_{11}\ v_{12}]$ and $v_2 = [v_{21}\ v22]$ form the rows of the generator matrix. A lattice vector is then obtained by taking an integer combination of these row vectors.

When a lattice is chosen to construct the quantization codebook, a subset of points is selected to obtain a codebook with a given (finite) number of bits. This is usually done by employing a technique called shaping. Shaping is performed by truncating the lattice according to a shaping boundary. The shaping boundary is typically centered at the origin but this does not have to be the case, and may be for instance rectangular, spherical, or pyramidal. FIG. 3 shows an example with a spherical shaping boundary.

The advantage of using a lattice is the existence of fast codebook search algorithms which can significantly reduce the complexity compared to unstructured codebooks in determining the nearest neighbor of a source vector x among all lattice points inside the codebook. There is also virtually no need to store the lattice points since they can be obtained from the generator matrix. The fast search algorithms generally involve rounding off to the nearest integer the elements of x subject to certain constraints such that the sum of all the rounded elements is even or odd, or equal to some integer in modulo arithmetic. Once the vector is quantized, that is, once the nearest lattice point inside the codebook is determined, usually a more complex operation consists of indexing the selected lattice point.

A particular class of fast lattice codebook search and indexing algorithms involves the concept of leaders, which is described in detail in the following references:

C. Lamblin and J.-P. Adoul. *Algorithme de quantification vectorielle sphérique à partir du réseau de Gosset d'ordre 8*. Ann. Télécommun., vol. 43, no. 3–4, pp. 172–186, 1988 (Lamblin, 1988);

J.-M. Moureaux, P. Loyer, and M. Antonini. *Low-complexity indexing method for $Z^n$ and $D_n$ lattice quantizers*. IEEE Trans. Communications, vol. 46, no. 12, December 1998 (Moureaux, 1998); and in P. Rault and C. Guillemot. *Indexing algorithms for $Z^n$, $A_n$, $D_n$, and $D_n^{++}$ lattice vector quantizers*. IEEE Transactions on Multimedia, vol. 3, no. 4, pp. 395–404, December 2001 (Rault, 2001).

A leader is a lattice point with components sorted, by convention, in descending order. An absolute leader is a leader with all non-negative components. A signed leader is a leader with signs on each component. Usually the lattice structure imposes constraints on the signs of a lattice point, and thus on the signs of a leader. The concept of leaders will be explained in more details hereinbelow.

A lattice often used in vector quantization is the Gosset lattice in dimension 8, denoted by $RE_8$. Any 8-dimensional lattice point y in $RE_8$ can be generated by $$y = [k_1 k_2 \ldots k_8] G_{RE_8} \quad (Eq.\ 3)$$

where $k_1, k_2, \ldots, k_8$ are signed integers and $G_{RE_8}$ is the generator matrix, defined as $$G_{RE_8} = \begin{bmatrix} 4 & 0 & 0 & 0 & 0 & 0 & 0 & 0 \\ 2 & 2 & 0 & 0 & 0 & 0 & 0 & 0 \\ 2 & 0 & 2 & 0 & 0 & 0 & 0 & 0 \\ 2 & 0 & 0 & 2 & 0 & 0 & 0 & 0 \\ 2 & 0 & 0 & 0 & 2 & 0 & 0 & 0 \\ 2 & 0 & 0 & 0 & 0 & 2 & 0 & 0 \\ 2 & 0 & 0 & 0 & 0 & 0 & 2 & 0 \\ 1 & 1 & 1 & 1 & 1 & 1 & 1 & 1 \end{bmatrix} = \begin{bmatrix} v_1 \\ v_2 \\ v_3 \\ v_4 \\ v_5 \\ v_6 \\ v_7 \\ v_8 \end{bmatrix} \quad (Eq.\ 4)$$

The row vectors $v_1, v_2, \ldots, v_8$ are the basis vectors of the lattice. It can be readily checked that the inverse of the generator matrix $G_{RE_8}$ is $$G_{RE_8}^{-1} = \frac{1}{4} \begin{bmatrix} 1 & 0 & 0 & 0 & 0 & 0 & 0 & 0 \\ -1 & 2 & 0 & 0 & 0 & 0 & 0 & 0 \\ -1 & 0 & 2 & 0 & 0 & 0 & 0 & 0 \\ -1 & 0 & 0 & 2 & 0 & 0 & 0 & 0 \\ -1 & 0 & 0 & 0 & 2 & 0 & 0 & 0 \\ -1 & 0 & 0 & 0 & 0 & 2 & 0 & 0 \\ -1 & 0 & 0 & 0 & 0 & 0 & 2 & 0 \\ 5 & -2 & -2 & -2 & -2 & -2 & -2 & 4 \end{bmatrix} \quad (Eq.\ 5)$$

This inverse matrix is useful to retrieve the basis expansion of y:

$$[k_1 k_2 \ldots k_8] = y G_{RE_8}^{-1} \quad (Eq.\ 6)$$

It is well-known that lattices consist of an infinite set of embedded spheres on which lie all lattice points. These spheres are often referred to as shells. Lattice points on a sphere in $RE_8$ can be generated from one or several leaders by permutation of their signed components. All permutations of a leader's components are lattice points with the same norm, and thus they fall on the same lattice shell. Leaders are therefore useful to enumerate concisely the shells of a lattice. Indeed, lattice points located on shells close to the origin can be obtained from a very small number of leaders. Only absolute leaders and sign constraints are required to generate all lattice points on a shell.

To design a $RE_8$ codebook, a finite subset of lattice points may be selected by exploiting the intrinsic geometry of the lattice, especially its shell structure. As described in (Lamblin, 1988), the lth shell of $RE_8$ has a radius $\sqrt{8l}$ where l is a non-negative integer. High radius shells comprise more lattice points than lower radius shells. It is possible to enumerate all points on a given shell using absolute and signed leaders, noting that there is a fixed number of leaders on a shell and that all other lattice points on the shell are obtained by permutations of the signed leader components, with some restrictions on the signs.

In spherical lattice VQ, it is sufficient to reorder in decreasing order the components of x and then perform a nearest-neighbor search among the leaders defining the codebook to determine the nearest neighbor of a source vector x among all lattice points in the codebook. The index of the closest leader and the permutation index obtained indirectly from the ordering operation on x are then sent to the decoder, which can reconstruct the quantized analog of x from this information. Consequently, the concept of leaders allows a convenient indexing strategy, where a lattice point can be described by a cardinality offset referring to a signed leader and a permutation index referring to the relative index of a permutation of the signed leader.

Based on the shell structure of a lattice, and on the enumeration of the lattice in terms of absolute and signed leaders, it is possible to construct a codebook by retaining only the lower radius shells, and possibly completing the codebook with a few additional leaders of higher radius shells. We refer to this kind of lattice codebook generation as near-spherical lattice shaping. This approach is used in M. Xie and J.-P. Adoul, *Embedded algebraic vector quantization (EAVQ) with application to wideband audio coding*, IEEE International Conference on Acoustics, Speech, and Signal Processing (ICASSP), Atlanta, Ga., U.S.A, vol. 1, pp. 240–243, 1996 (Xie, 1996).

For $RE_8$, the absolute leaders in shells of radius 0 and $\sqrt{8}$ are shown below.

Absolute leader for the shell of radius 0
[0 0 0 0 0 0 0 0]
Absolute leaders for the shell of radius $\sqrt{8}$
[2 2 0 0 0 0 0 0] and [1 1 1 1 1 1 1 1]

A more complete listing for low-radius shells, for the specific case of $RE_8$, can be found in Lamblin (1988).

For lattice quantization to be used in transform coding with adaptive bit allocation, it is desirable to construct multi-rate lattice codebooks. A possible solution consists of exploiting the enumeration of a lattice in terms of leaders In a similar way as in Xie (1996). As explained in Xie, a multi-rate leader-based lattice quantizer may be designed with for instance:

embedded algebraic codebooks, whereby lower-rate codebooks are subsets of higher-rate codebooks, or
nested algebraic codebooks, whereby the multi-rate codebooks do not overlap but are complementary in a similar fashion as a nest of Russian dolls.

In the specific case of Xie, multi-rate lattice quantization uses six of codebooks named $Q_0, Q_1, Q_2, \ldots, Q_5$, where the last five codebooks are embedded, i.e. $Q_1 \subset Q_2 \subset \ldots \subset Q_5$. These codebooks are essentially derived from an 8-dimensional lattice $RE_8$. Following the notations of Xie, $Q_n$ refers to the nth $RE_8$ codebook. The bit allocation of codebook $Q_n$ is 4n bits corresponding to $2^{4n}$ entries. The codebook bit rate being defined as the ratio between the number of bits allocated to a source vector and the dimension of the source vector, and in $RE_8$ quantization, the dimension of the source vector being 8, the codebook bit rate of $Q_n$ is 4n/8=n/2 bits per dimension.

With the technique of Xie, the codebook bit rate cannot exceed 5/2 bits per dimension. Due to this limitation, a procedure must be applied to saturate outliers. An outlier is defined as a point x in space that has the nearest neighbor y in the lattice RE8 which is not in one of the multi-rate codebooks $Q_n$. In Xie, such points are scaled down by a factor g>1 until x/g is no more an outlier. Apparently the use of g may result in large quantization errors. This problem is fixed in Xie (1996) by normalizing the source vector prior to multi-rate lattice quantization.

There are disadvantages and limitations in the multi-rate quantization technique of Xie, including:

1. Outlier saturation is usually a computation burden. Further, saturation may degrade significantly the quantization performance (hence quality) in the case of large outliers.
2. The technique handles outliers with saturation and does not allow to allocate more than 20 bits per 8-dimensional vector. This may be a disadvantage in transform coding, since high-energy vectors (which are more likely to be outliers) shall be normally quantized with a small distortion to maximize quality, implying it shall be possible to use a codebook with enough bits allocated to a specific vector.
3. The codebooks $Q_2, Q_3, Q_4$ and $Q_5$ of 8, 12, 16 and 20 bits are specified with 3, 8, 23 and 73 absolute leaders, respectively. Since storage requirements and search complexity are closely related to the number of absolute leaders, the complexity of these lattice codebooks explodes with increasing codebook bit rate.
4. The performance of embedded codebooks is slightly worse than that of non-overlapping (i.e. nested) codebooks.

Another kind of lattice shaping, as opposed to near-spherical shaping, is Voronoi shaping, which is described in J. H. Conway and N. J. A. Sloane, *A fast encoding method for lattice codes and quantizers*, IEEE Trans. Inform. Theory, vol. IT-29, no. 6, pp. 820–824, November 1983 (Conway, 1983). It relies on the concept of Voronoi region described for instance in A. Gersho and R. M. Gray, *Vector Quantization and Signal Compression*, Kluwer Academic Publishers, 1992 (Gersho, 1992). In the specific case of a lattice codebook, a Voronoi region is the region of space where all points in N-dimensional space are closer to a given lattice point than any other point in the lattice. Each lattice point has an associated closed Voronoi region that includes also the border points equidistant to neighboring lattice points. In a given lattice, all Voronoi regions have the same shape, that is, they are congruent. This is not the case for an unstructured codebook.

A Voronoi codebook is a subset of a lattice such that all points of the codebook fall into a region of space with same shape as the Voronoi region of the lattice, appropriately scaled up and translated. To be more precise, a Voronoi codebook $V^{(r)}$ derived from the lattice $\Lambda$ in dimension N is defined as $$V^{(r)} = \Lambda \cap (2^r V_\Lambda(0) + a) \quad \text{(Eq. 7)}$$

where r is is a non-negative integer parameter defined later in more detail, $V_\Lambda(0)$ is the Voronoi region of $\Lambda$ around the origin, and a an appropriate N-dimensional offset vector. Equation 7 is interpreted as follows: "the Voronoi codebook $V^{(r)}$ is defined as all points of the lattice $\Lambda$ included in the region of N-dimensional space inside a scaled-up and translated Voronoi region $V_\Lambda(0)$, with the scaling factor $m=2^r$ and the offset vector a". With such a definition, the codebook bit rate of $V^{(r)}$ is r bits per dimension. The role of a is to fix ties, that is, to prevent any lattice point to fall on the shaping region $2^r V_\Lambda(0)+a$.

FIG. 4 illustrates Voronoi coding, Voronoi regions, and tiling of Voronoi regions in the two-dimensional hexagonal lattice $A_2$. The point o refers to the origin. Both points o and z fall inside the same boundary marked with dashed lines. This boundary is actually a Voronoi region of $A_2$ scaled by m=2 and slightly translated to the right to avoid lattice points on the region boundary. There are in total 4 lattice points marked with three dots (•) and a plus (+) sign within the boundary comprising o and z. More generally each such a region contains $m^N$ points. It can be seen in FIG. 4 that the same pattern, a Voronoi region of $A_2$ scaled by m=2, is duplicated several times. This process is called tiling. For instance, the points o' and z' can be seen as equivalent to o and z, respectively, with respect to tiling. The point z' may be written as z'=o'+z where o' is a point of $2A_2$. The points of $2A_2$ are shown with plus signs in FIG. 4. More generally, the whole lattice can be generated by tiling all possible translations of a Voronoi codebook by points of the lattice scaled by m.

As described in D. Mukherjee and S. K. Mitra, *Vector set-partitioning with successive refinement Voronoi lattice VQ for embedded wavelet image coding*, Proc. ICIP, Part I, Chicago, Ill., October 1998, pp. 107–111 (Mukherjee, 1998), Voronoi coding can be used to extend lattice quantization by successive refinements. The multi-stage technique of Mukherjee produces multi-rate quantization with finer granular descriptions after each refinement. This technique, which could be used for multi-rate quantization in transform coding, has several limitations:

1. The quantization step is decreased after each successive refinement, and therefore it cannot deal efficiently with large outliers. Indeed, if a large outlier occurs in the first stage, the successive stages cannot reduce efficiently the resulting error, because they are designed to reduce granular noise only. The performance of the first stage is therefore critical.
2. The property of successive refinements implies constraints on the successive quantization steps. This limits the quantization performance.

OBJECTS OF THE INVENTION

An object of the present invention is to provide improved method and system to construct, search and index a multi-rate lattice vector quantizer.

Another object of the present invention is to provide an improved search and indexing method for lattice codebooks.

SUMMARY OF THE INVENTION

The above objects are achieved by a multi-rate quantizer using a set of lattice codebooks, called base codebooks, and extension which makes it possible to obtain higher bit rate codebooks from the base codebooks compared to quantizers from the prior art.

More specifically, in accordance with a first aspect of the present invention, there is provided a multi-rate lattice quantization encoding method comprising:

i) providing a source vector x representing a frame from a source signal;
ii) providing a base codebook C derived from a lattice $\Lambda$;
iii) associating to x a lattice point y in the lattice $\Lambda$;
iv) if y is included in the base codebook C then indexing y in the base codebook C yielding quantization indices, and ending the method, if not then
v) extending the base codebook, yielding an extended codebook;
vi) associating to y a codevector c from the extended codebook; and
vii) indexing y in the extended codebook yielding quantization indices.

According to a second aspect of the present invention, there is provided a multi-rate lattice quantization decoding method comprising:

i) providing a base codebook C derived from a lattice $\Lambda$;
ii) providing a codebook number n and a quantization index i;
iii) demultiplexing the quantization index i using the codebook number n;
iv) if n=0 then decoding the index i using the base codebook, yielding a quantized vector y, and ending the method;
v) if n>0 then
  a) providing a preselected Voronoi codebook $V^{(r)}$;
  b) setting an extension order to r=n and a scale factor $m=2^r$;
  c) demultiplexing indices j and k from i;
  d) decoding j into c in the base codebook C;
  e) decoding k into v in the Voronoi codebook $V^{(r)}$; and
  f) reconstructing a quantized vector as $y=mc+v.$ In accordance to a third aspect of the present invention, there is also provided a method for lattice codebook extension comprising:

i) providing a subset of vectors from a lattice L of vectors, yielding a base codebook;
ii) scaling the base codebook by a predetermined scale factor, yielding scaled codevectors; and
iii) inserting a Voronoi codebook around each scaled codevector, yielding an extended codebook.

The disclosed extension method can be used with codebooks derived from any lattice of any dimension. However, according to an illustrative embodiment of the invention, the 8-dimensional Gosset lattice RE8 is used along with near-spherical base codebooks specified by optimized tables of leaders.

In addition to a multi-rate lattice vector quantization method, methods for fast searching and indexing in lattice codebooks that makes use of identifiers of absolute leaders, are also provided according to another illustrative embodiment of the present invention. These methods are not specific to the RE8 lattice and may be used in the context of any lattice with or without an extension.

According to a fourth aspect of the present invention, there is provided a multi-rate lattice quantization encoder comprising:

receiving means for providing a source vector x representing a frame from a source signal;

memory means including a base codebook C derived from a lattice $\Lambda$;

means associating to x a lattice point y in the lattice $\Lambda$;

means for verifying if y is included in the base codebook C and for indexing y in the base codebook C yielding quantization indices;

means for extending the base codebook and for yielding an extended codebook;

means for associating to y a codevector c from the extended codebook; and means for indexing y in the extended codebook C and for yielding quantization indices.

Finally, according to a fifth aspect of the present invention, there is provided a multi-rate lattice quantization decoder comprising:

memory means for providing a base codebook C derived from a lattice $\Lambda$;

receiving means for providing an encoded codebook number n and an encoded index i;

means for demultiplexing the quantization index i using the codebook number n;

means for verifying if n=0, and a) for decoding the index i using the base codebook, yielding a quantized vector y;

means for verifying if n>0;

means for providing a preselected Voronoi codebook $V^{(r)}$;

means for setting an extension order to r=n and a scale factor $m=2^r$;

means for demultiplexing indices j and k from i;

means for decoding j into c in the base codebook C;

means for decoding k into V in the Voronoi codebook $V^{(r)}$; and means for reconstructing a quantized vector as y=m c+v.

According to methods and systems from the present invention, a two-dimensional base codebook C is extended by scaling it by successive powers of 2 and tiling a Voronoi codebook V(r) around each point of the scaled base codebook. Therefore, the extension method is referred to as Voronoi extension. The extension order r is the number of times the extension is applied. The extended codebooks C(r) comprise more points and extend higher up in the vector space capturing outliers, while keeping the same granularity as the base codebook. This is attained at a cost of increased bit rate required to index not only the base codebook but also the Voronoi codebook, and to transmit side information on the extension order. The bit rate of the multi-rate quantizer obtained by the disclosed means is source-dependent. The number of bits used for indexing the Voronoi codebook is referred to as overhead.

Other objects, advantages and features of the present invention will become more apparent upon reading the following non restrictive description of illustrative embodiments thereof, given by way of example only with reference to the accompanying drawings.

BRIEF DESCRIPTION OF THE DRAWINGS

In the appended drawings:

FIGS. 19A–19B are schematic views illustrating the structure of the codevector index i as produced by the encoding method of FIG. 18 respectively in the case where no extension is used, and when extension is used.

DESCRIPTION OF ILLUSTRATIVE EMBODIMENTS

Turning first to FIGS. 5 to 14 a method for multi-rate lattice codebooks extension according to a first illustrative embodiment of a first aspect of the present invention will be described. The extension methods according to the present invention will be referred to herein as Voronoi extension methods.

This first illustrative embodiment is described by way of a two-dimensional example based on an hexagonal lattice $A_2$.

For the sake of clarity, key symbols related to the first illustrative embodiment are gathered in Table 1.

TABLE 1

List of symbols related to Voronoi extension method in accordance with a first illustrative embodiment of the present invention.

| Symbol | Definition | Note |
|---|---|---|
| $A_2$ | Hexagonal lattice in dimension 2. | |
| N | Source dimension. | |
| $\Lambda$ | Lattice in dimension N. | E.g., $\Lambda = A_2$ with N = 2. |
| x | Source vector in dimension N. | |
| y | Closest lattice point to x in $\Lambda$. | |
| n | Codebook number. | |
| i | Codevector index. When the extension is not applied, i is an index to C represented with NR bits. With the extension, i is an index to the extended codebook $C^{(r)}$ comprising a multiplex of j and k, where j is an index to C and k is a Voronoi index corresponding to v. In this case, i is represented with N(R + r) bits. | |
| a | Offset for Voronoi coding, a vector in dimension N. | |
| r | Extension order, a non-negative integer. | |
| m | Scaling factor of the extension. | $m = 2^r$ |
| c | Base codevector in C. | |
| v | Voronoi codevector in $\Lambda$. | Computed such that v is congruent to y. |
| C | Base codebook in $\Lambda$. | Comprises $2^{NR}$ entries. |
| R | Bit rate of the base codebook C in bits per dimension. | |
| $C^{(r)}$ | Extended codebook of order r. | See Eq. 9 for definition. |
| k | Voronoi index in $V^{(r)}$, represented with Nr bits. | See Eq. 10 for the computation of k. |
| $G_\Lambda$ | Generator matrix of $\Lambda$. | |
| w | Difference vector w = y − v. | |
| $V^{(r)}$ | Voronoi codebook of order r. | See Eq. 7 for definition. |
| $V_\Lambda(0)$ | Voronoi region of $\Lambda$ around the origin. | |
| $\mathrm{mod}_m$ | Modulo operation on a vector. If $y = [y_1 \ldots y_8]$, then $\mathrm{mod}_m(y) = [y_1 \bmod m \ldots y_8 \bmod m]$ where mod is the scalar modulo. | |

Figure 5:
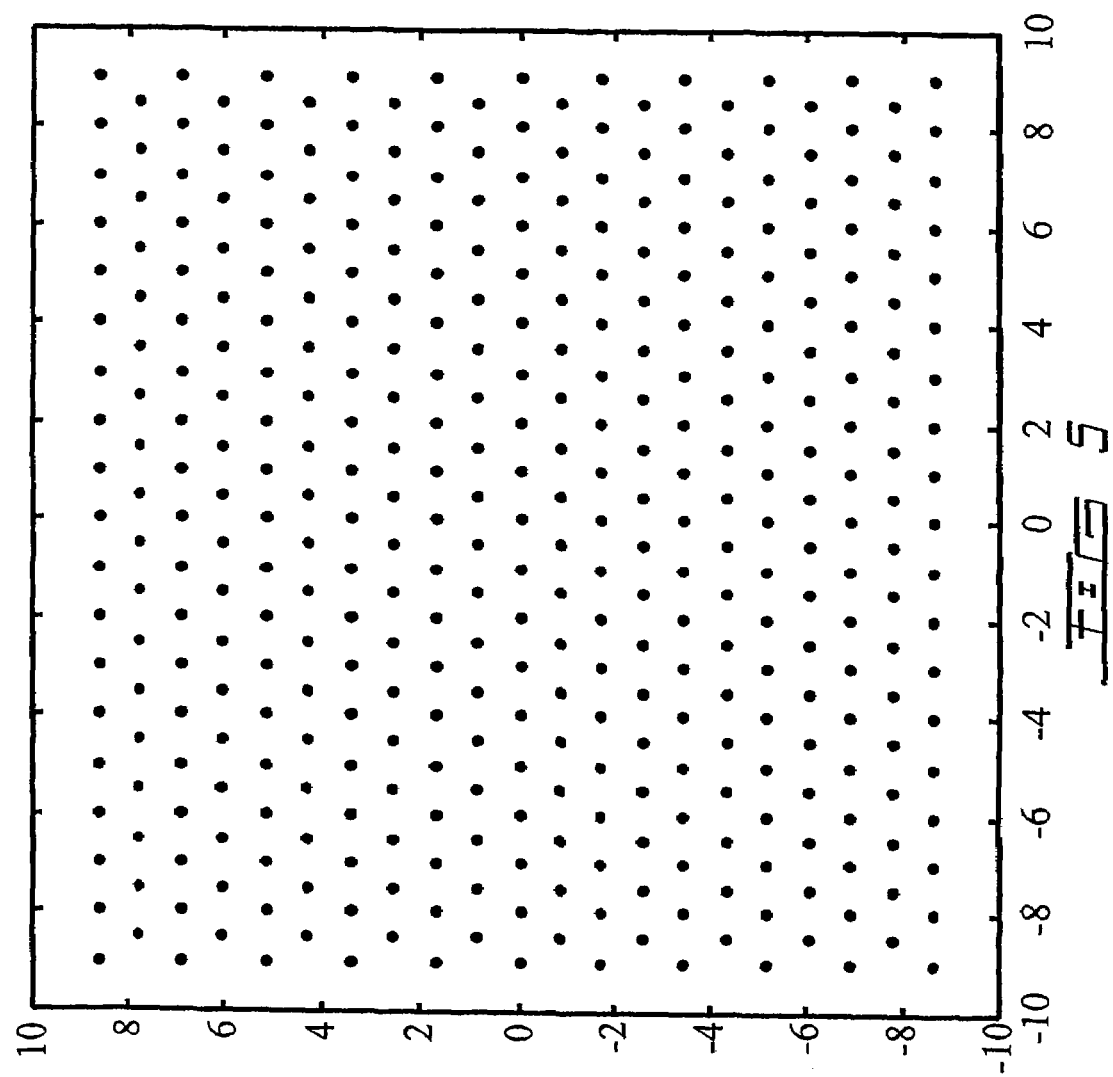
FIG. 5 is a graph illustrating points from the hexagonal lattice $A_2$.
Figure 6:
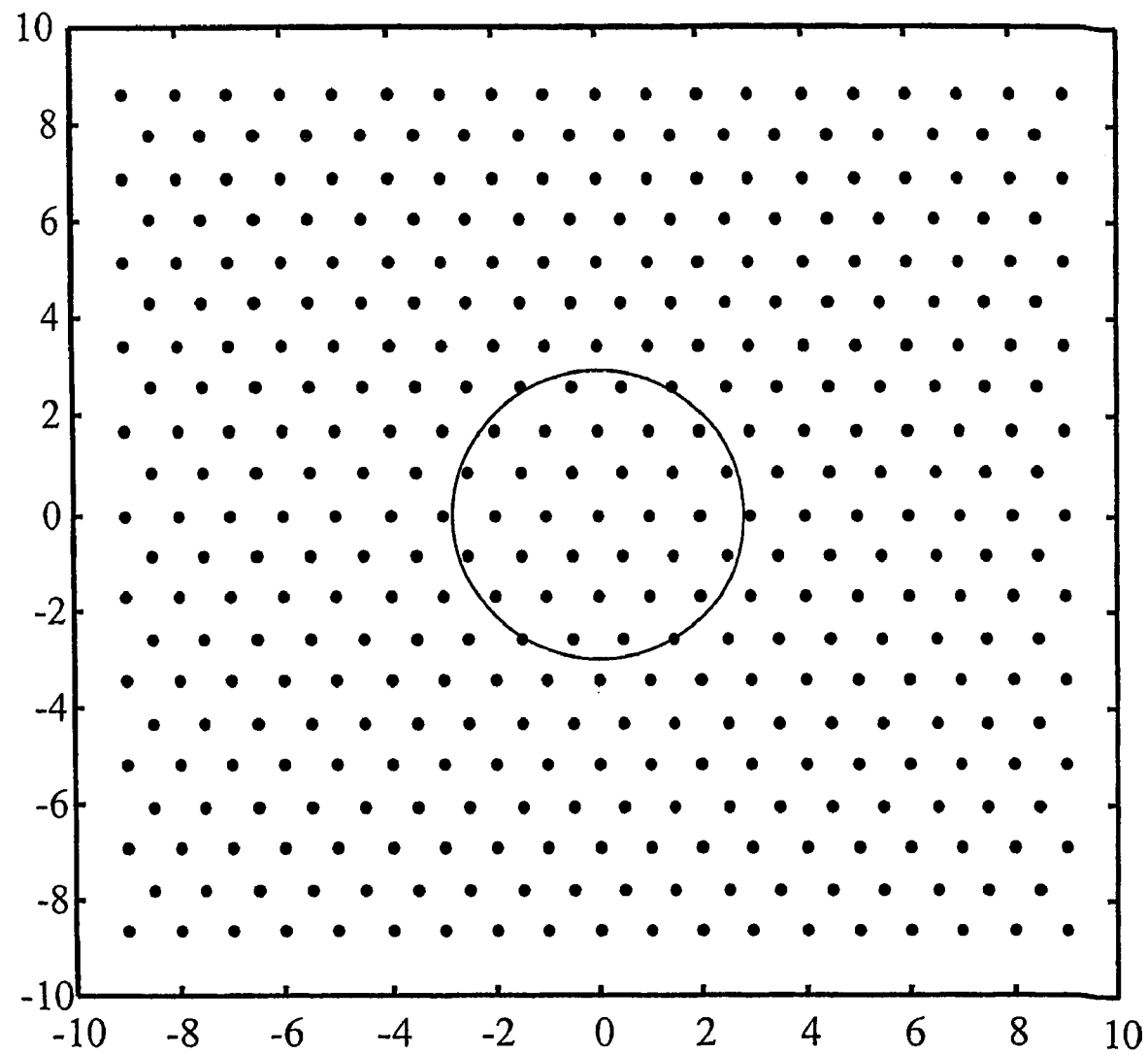
FIG. 6 is the graph of FIG. 5, including a shaping boundary for defining a base codebook.
Figure 7:
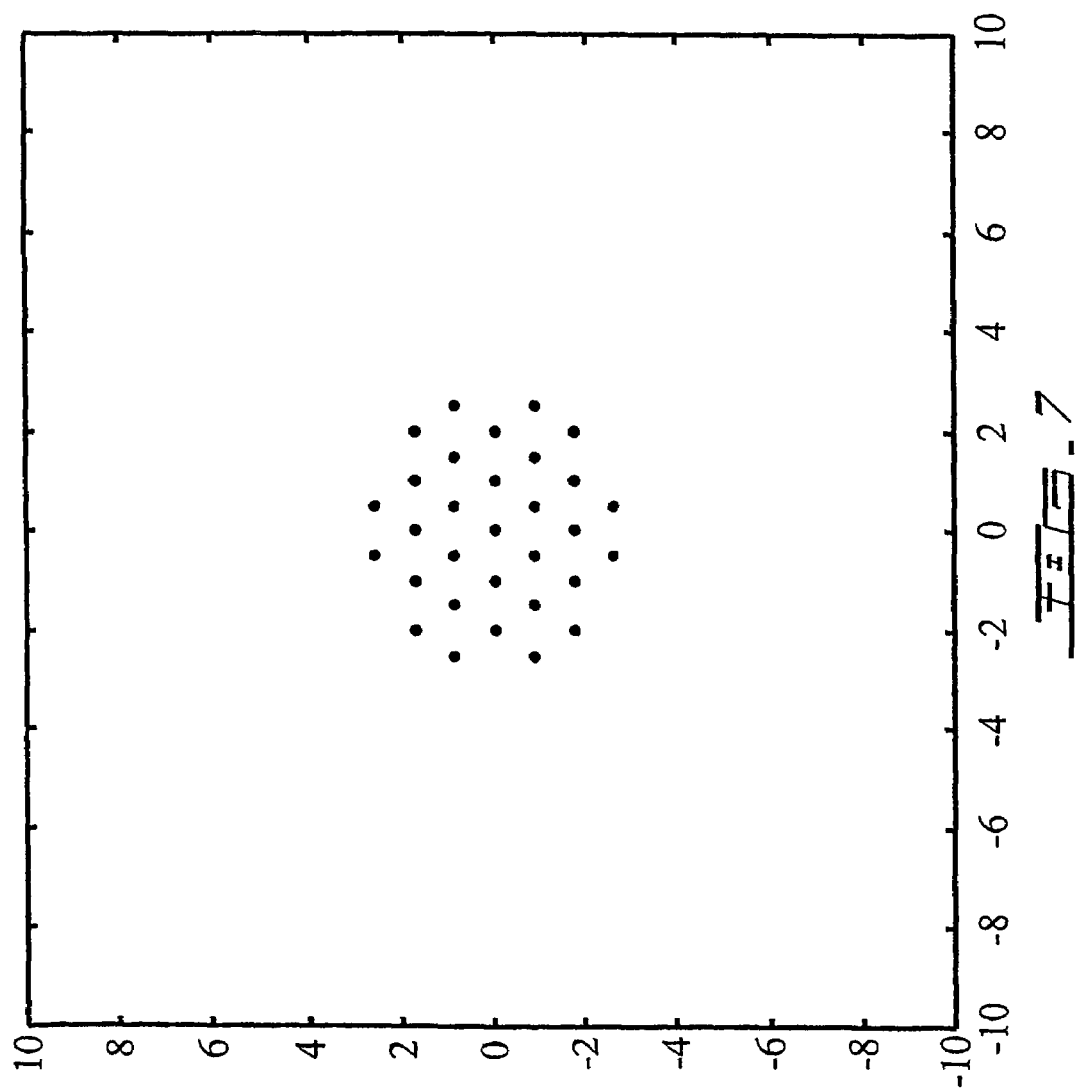
FIG. 7 is a graph illustrating a base codebook C obtained by retaining only the lattice points that fall into the shaping boundary shown in FIG. 6.
Figure 8:
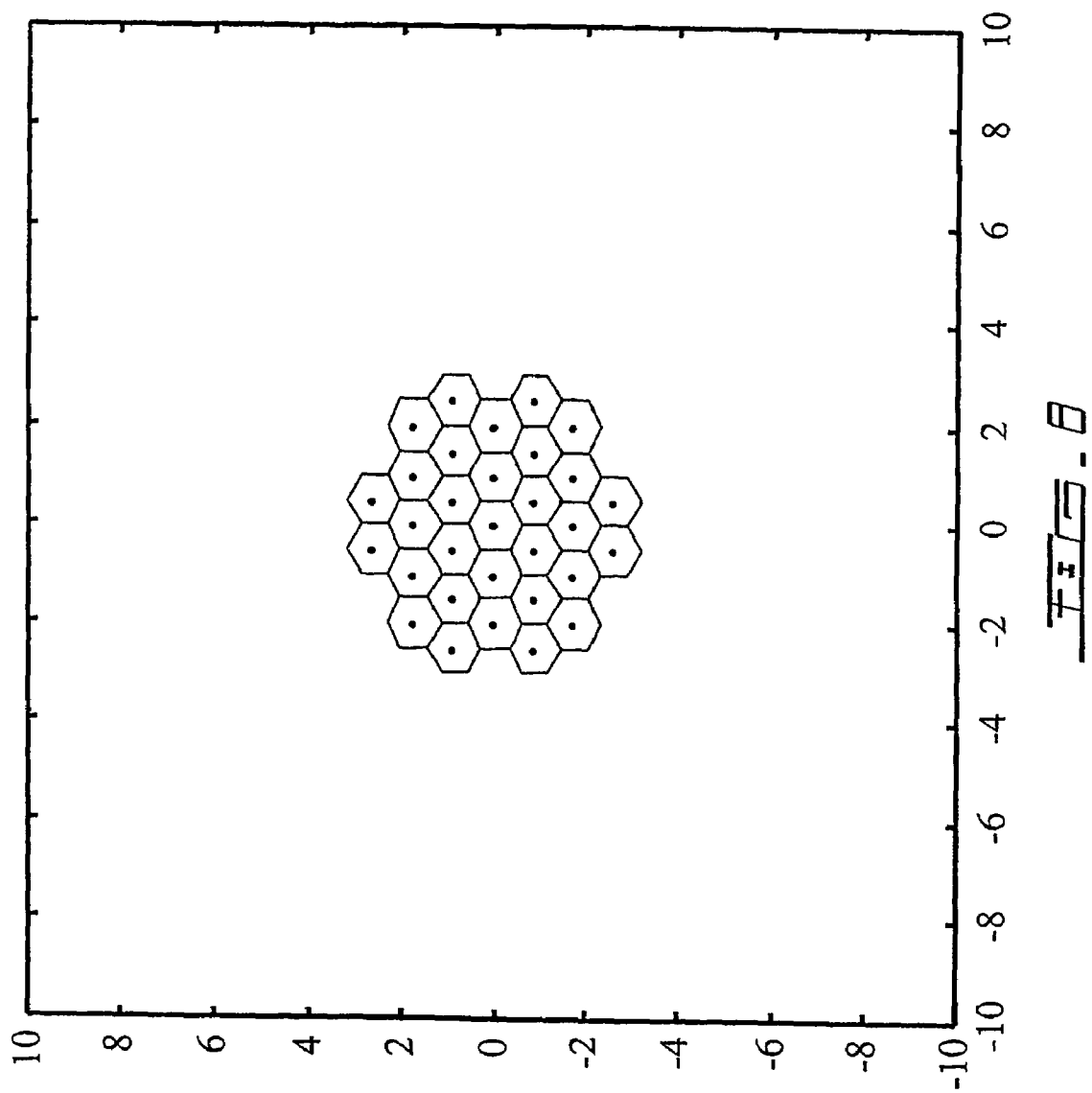
FIG. 8 is a graph illustrating the base codebook C from FIG. 7, with Voronoi regions around each codevector.

FIG. 5 shows a part of the hexagonal lattice $A_2$ that extends to infinity. A base codebook is obtained by appropriately shaping this lattice to get a finite set of lattice points. This is illustrated in FIG. 6, where a spherical shaping boundary is shown with solid line, and in FIG. 7, where only the lattice points inside the shaping boundary are retained. The points inside the shaping boundary comprise the base codebook C. Even though spherical shaping is used in the present illustrative embodiment, other boundaries can alternatively be used, such as a square, a pyramid, a rectangle, etc.

In this particular example, the base codebook C comprises 31 lattice points, and for the sake of simplicity, we will assume that an index i of 5 bits is used to label this codebook. The Voronoi regions of the base codebook are the hexagonal areas centered around each lattice point shown with dots (•) in FIG. 8.

Figure 9:
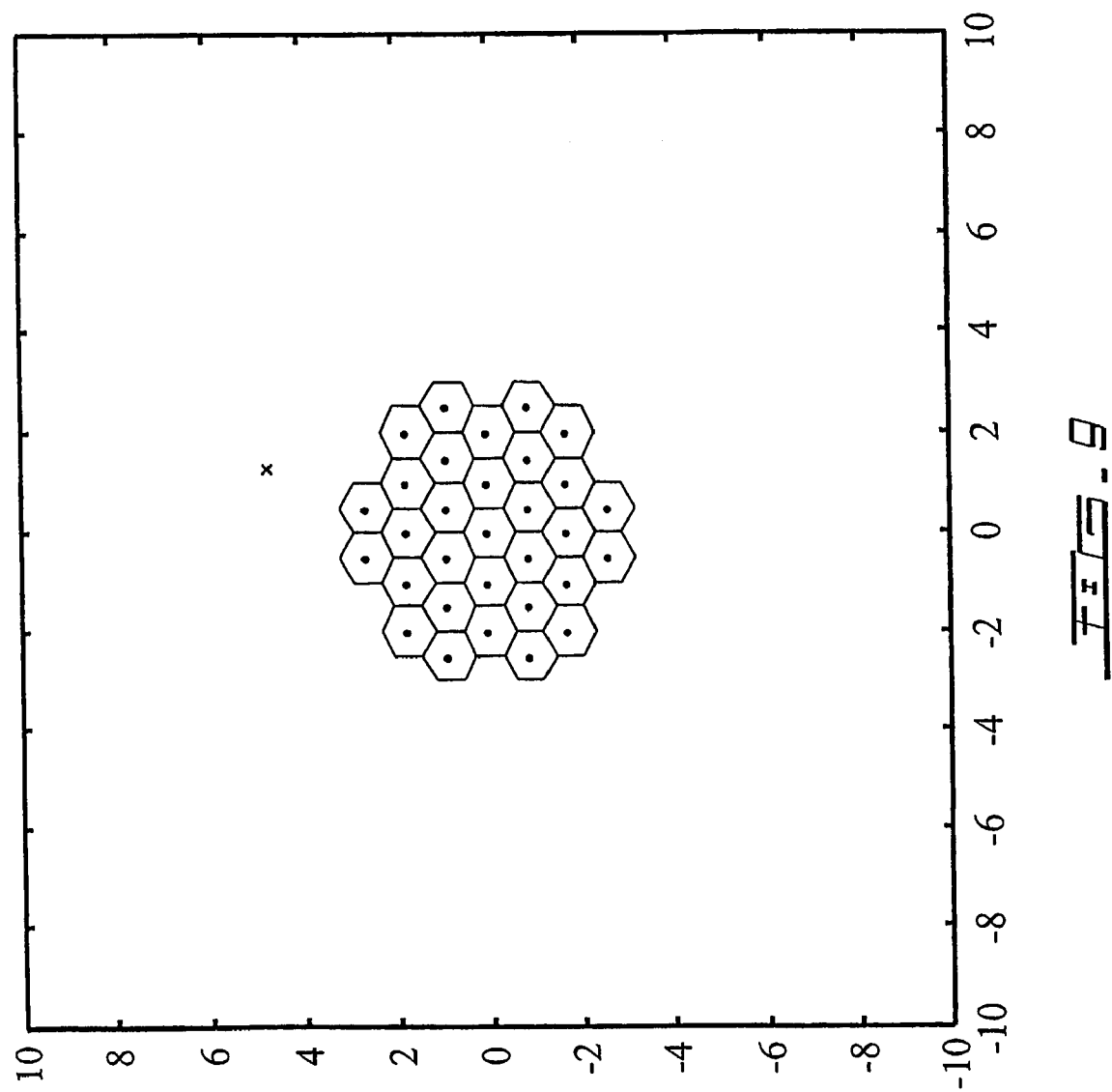
FIG. 9 is the graph of FIG. 8 illustrating the position of a source vector.
Figure 10:
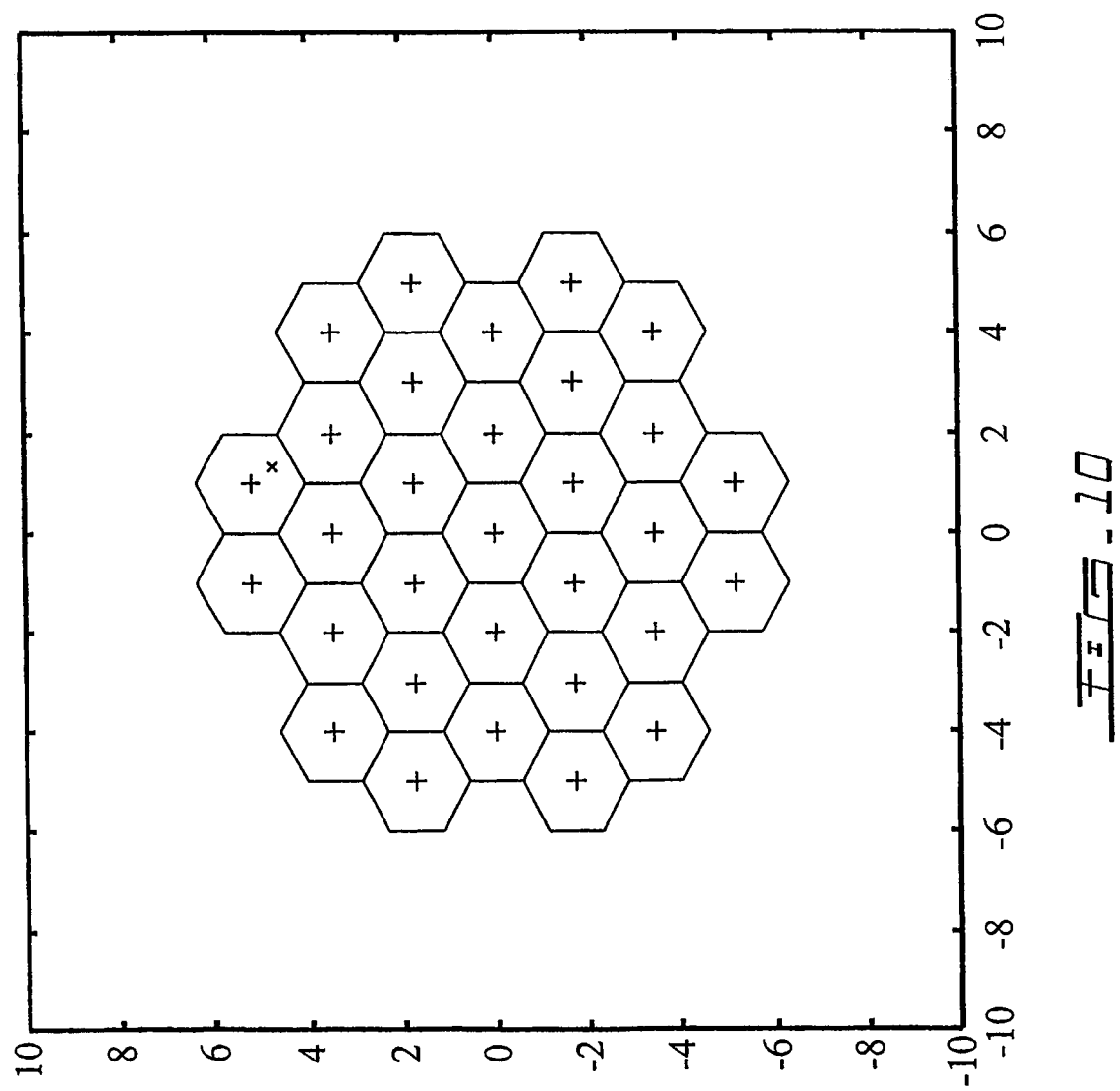
FIG. 10 is a graph illustrating the base codebook C from FIG. 8 scaled by the factor m=2.

FIG. 9 shows a source vector x in a two-dimensional plane. One can see in this illustrative example that the nearest neighbor y (not shown) of x in the lattice is not an entry of the base codebook C. It is to be noted that the nearest neighbor search is not limited to the base codebook C; the nearest neighbor y being defined as the closest point to x in the whole lattice $A_2$. In the specific case of FIG. 9, y is an outlier. It is reminded that a prior art method for dealing with such an outlier y is to scale the codebook by a given factor, for example a power of 2, resulting in a scaled codebook illustrated in FIG. 10. However, this would increase the Voronoi region, and thus the granular distortion.

Figure 11:
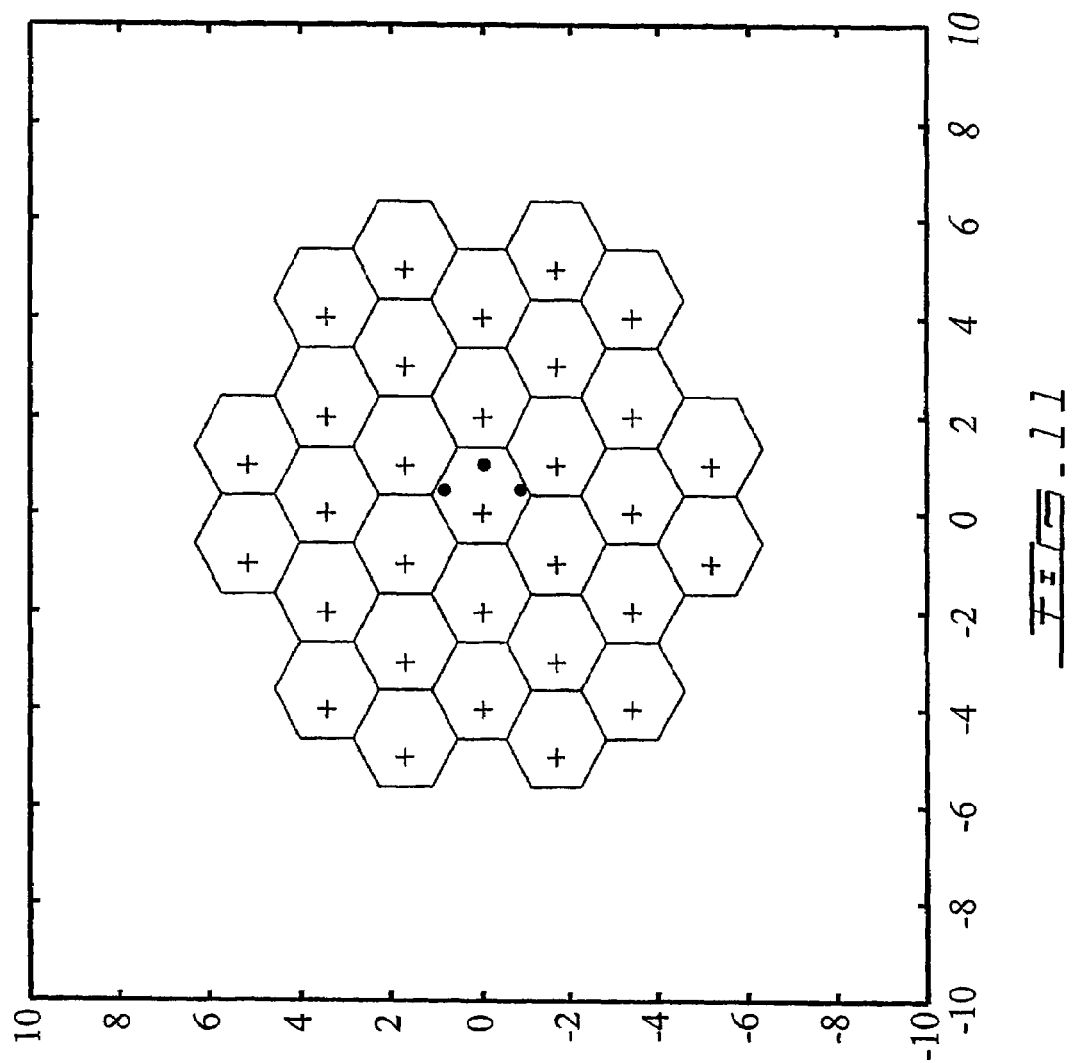
FIG. 11 is a graph illustrating the scaled base codebook from FIG. 10, with the shifted, scaled Voronoi regions, and a Voronoi codebook comprising 4 points.
Figure 12:
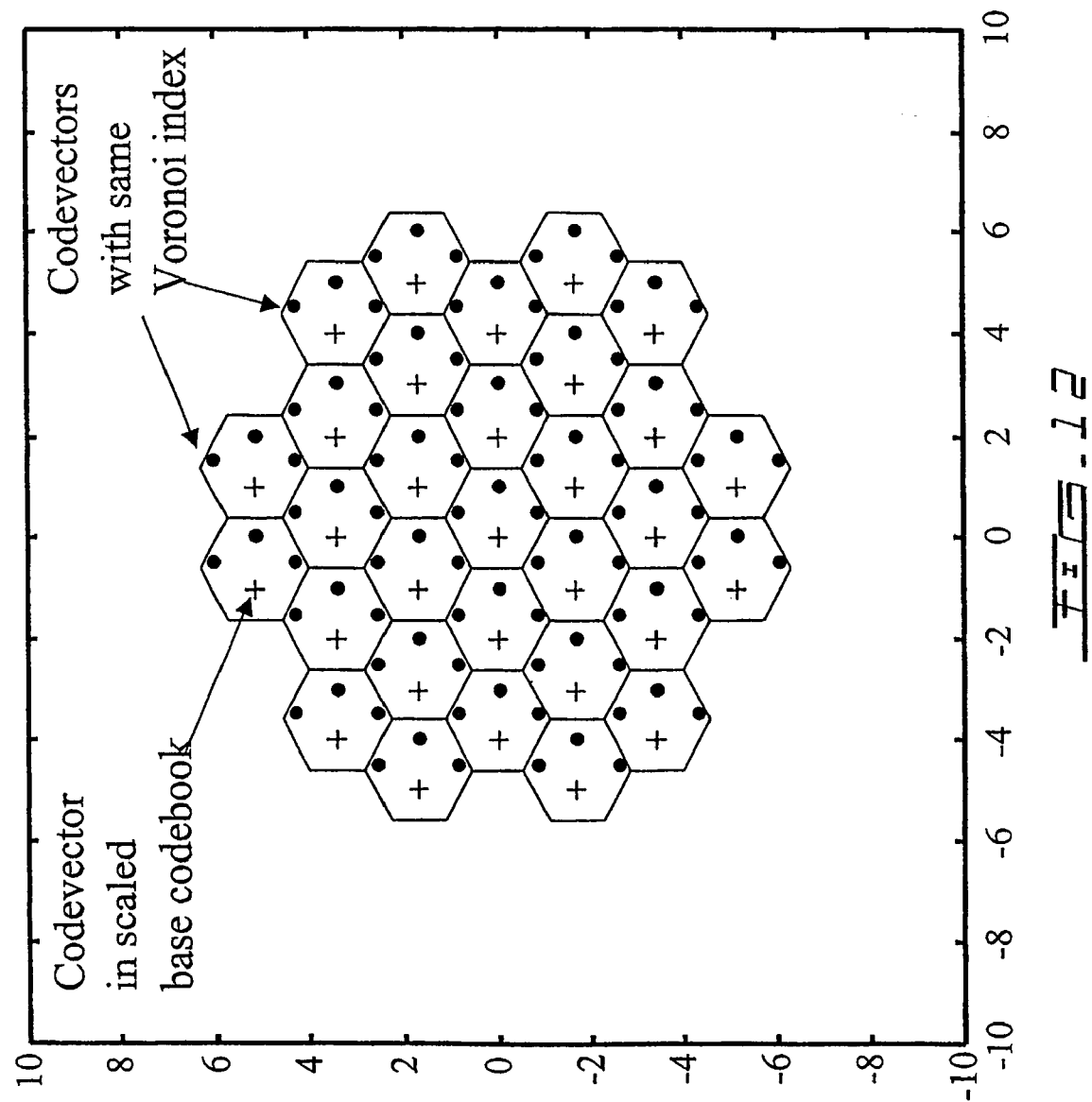
FIG. 12 is the graph from FIG. 11, illustrating an extended codebook of order r=1.
Figure 13:
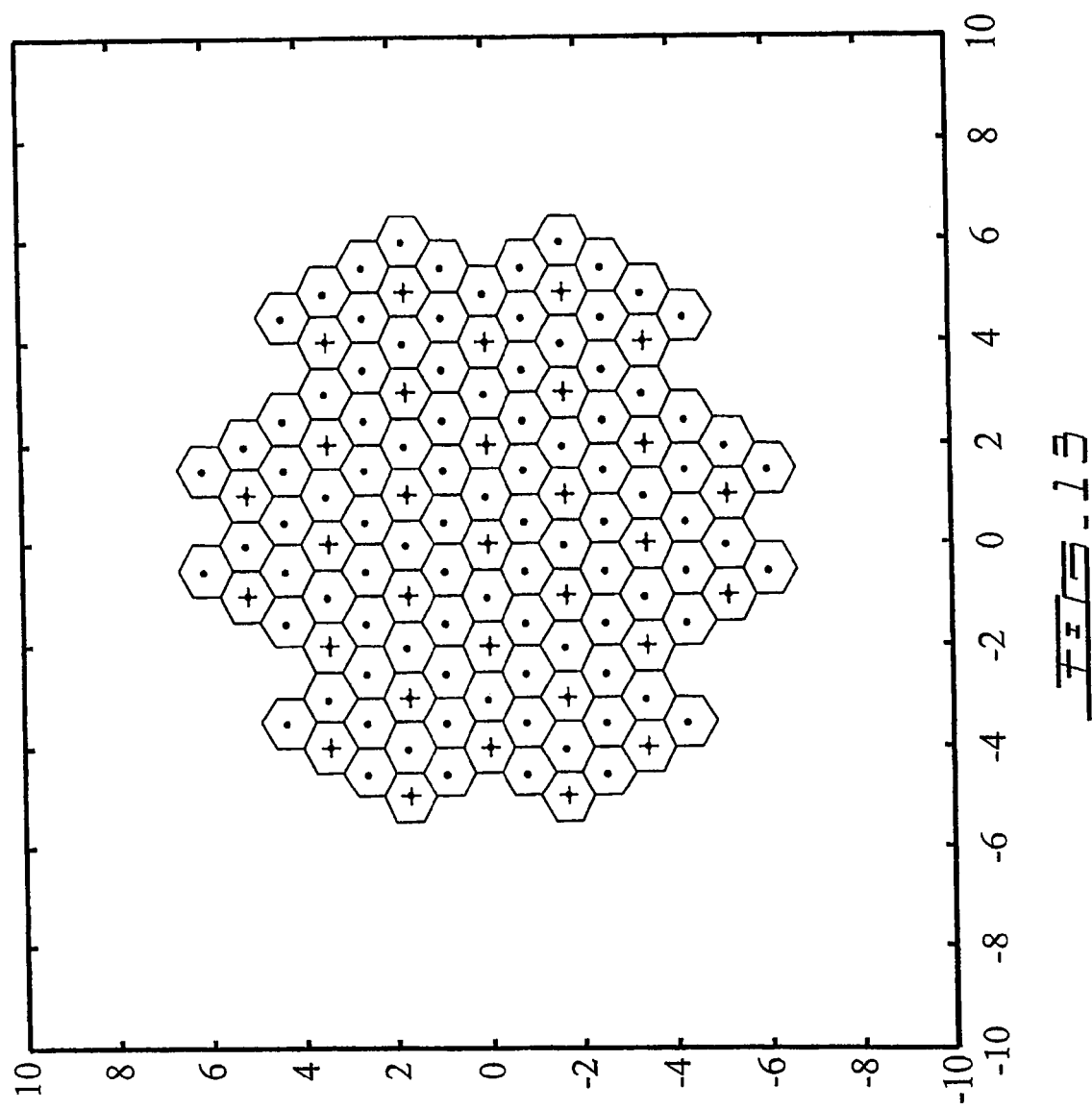
FIG. 13 is a graph illustrating the extended codebook from FIG. 12 with the related Voronoi regions.
Figure 14:
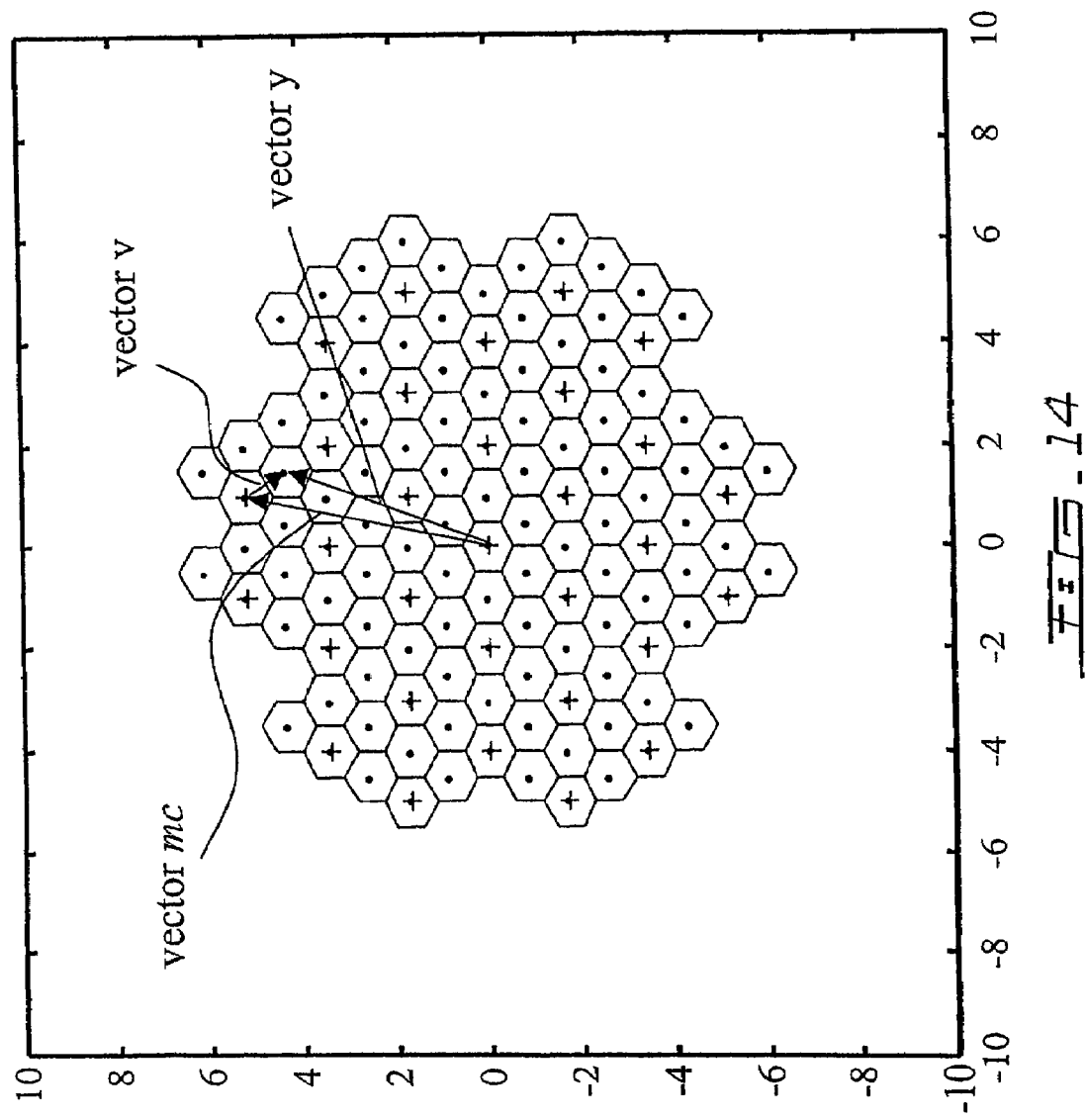
FIG. 14 is the graph from FIG. 13, illustrating the quantized vector y, reconstructed as a sum of the scaled codevector mc and the codevector v of the Voronoi codebook.

To keep the same Voronoi region for maintaining the granularity while extending the codebook to include the outlier, the base codebook is scaled by 2, and a Voronoi codebook is inserted around each scaled codevector as shown in FIGS. 11 and 12. This scaling procedure yields a Voronoi codebook $V^{(1)}$ in two dimensions comprising 4 lattice points and requiring 2 additional bits as an overhead to index it. The resulting extended codebook $C^{(1)}$ is depicted in FIG. 13. As can be seen in FIG. 13, the nearest neighbor y of x is no more an outlier, since it belongs to the extended codebook. However, 5+2=7 bits are now required to describe y in the extended codebook compared to the 5 bits required by the base codebook without any extension. As shown in FIG. 14, the quantized vector y can be represented as $$y = mc + v \qquad \text{(Eq. 8)}$$

where m is the extension scaling factor (here, m=2), c is a codevector of the base codebook C, and v belongs to the Voronoi codebook used to extend C.

Following this last two-dimensional example illustrating a method to extend lattice codebooks to prevent saturation, a lattice codebook extension method according to the first aspect of the present invention will now be presented with reference to a second illustrative embodiment.

It is now assumed that a base codebook C is derived from a lattice $\Lambda$ in dimension N having a bit rate of R bits per dimension. In other words, C contains $2^{NR}$ N-dimensional codevectors and requires NR bits for indexing.

The extension includes scaling the base codebook by successive powers of 2 (2, 4, 8, etc.), and tiling a Voronoi codebook around each point of the scaled base codebook. For this reason, the extension method is referred to herein as Voronoi extension. The extension of the base codebook C of order r is the codebook $C^{(r)}$ defined as $$C^{(r)} = \bigcup_{\substack{c \in C \\ v \in V^{(r)}}} mc + v \quad \text{(Eq. 9)}$$

where $m=2^r$ and $V^{(r)}$ is a Voronoi codebook of size $m^N=2^{rN}$ derived from the same lattice $\Lambda$ as C. The extension order r defines the number of times the extension has been applied. The extended codebooks comprise more codevectors and consequently use more bits than the base codebook C. The definition in Eq. 9 implies that the extension codebook $C^{(r)}$ requires NR bits for indexing first the base codebook and then Nr bits for the Voronoi codebook, resulting in a total of N(R+r) bits plus side information on the extension order r.

The scaling of the base codebook by successive powers of 2 allows to have Voronoi indices represented on an exact number of bits (not fractional). However in general, m may be any integer superior or equal to 2.

Note that the granularity of this basic form of Voronoi extension is 1 bit per dimension, since the Increment in codebook bit rate is 1 bit per dimension from the rth to the (r+1)th extension.

It is to be noted that the previous two-dimensional example used a specific base codebook C derived from the lattice $A_2$. In the example case of FIG. 7, $\Lambda=A_2$, N=2, and the bit rate of the base codebook R=5/2 bits per dimension.

Figure 15:
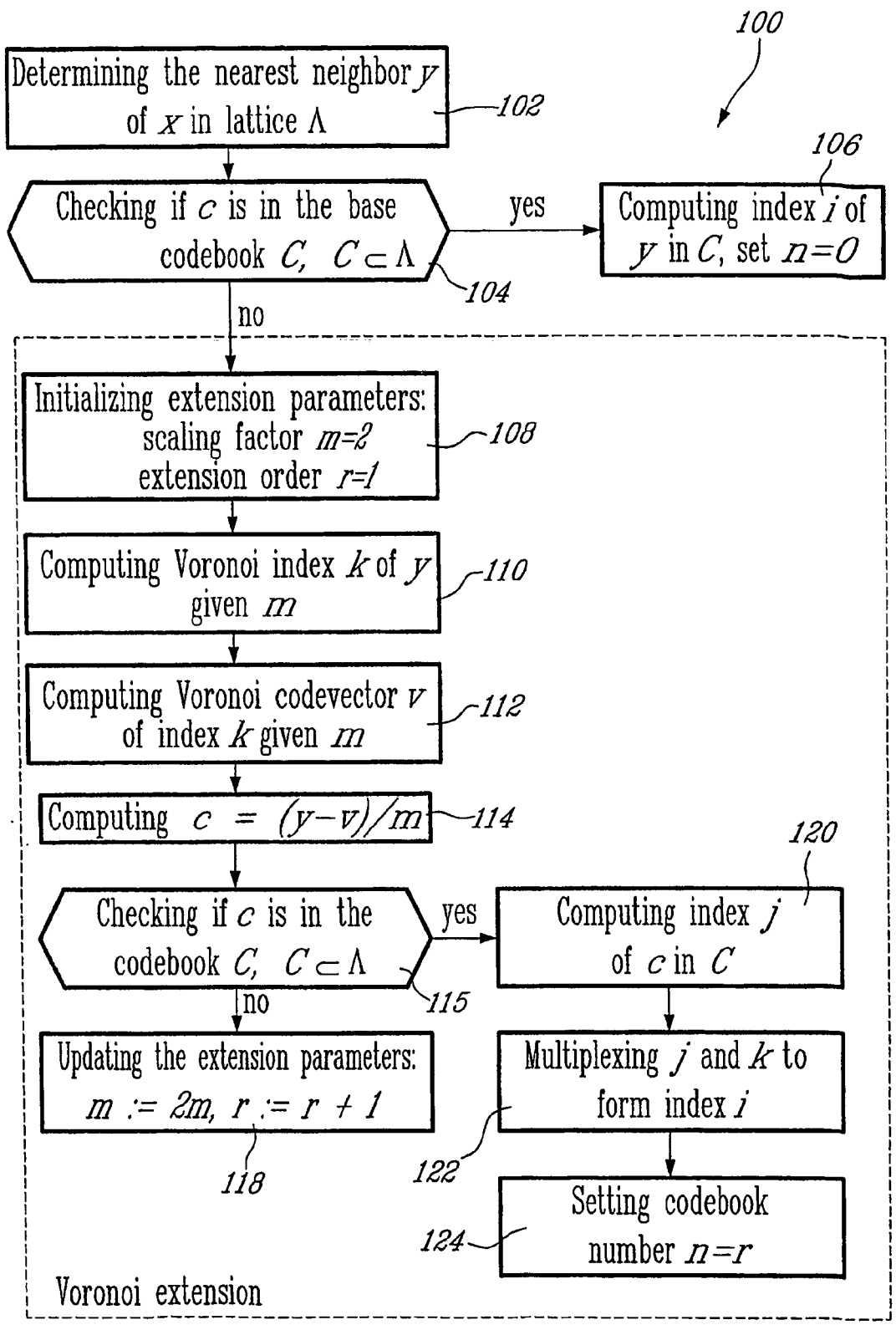
FIG. 15 is a flow chart illustrating a multi-rate lattice quantization encoding method according a first illustrative embodiment of a second aspect of the present invention.

A multi-rate lattice quantization encoding method 100 according to a first illustrative embodiment of a second aspect of the present invention will now be described with reference to FIG. 15.

Let x be an N-dimensional source vector to be quantized. Let C denote the base codebook derived from a lattice $\Lambda$, and define m $\Lambda$ as the lattice $\Lambda$ scaled by an integer factor m>0. Then, the steps to encode a vector x using C or one of its extensions according to the method 100 are as follows:

In step 102, the nearest neighbor y of x is determined in the infinite lattice $\Lambda$. Step 102 yields a quantized vector y.

Then, in step 104, it is determined if y is an entry of the base codebook C. If y is in C (step 106), the number of bits used to quantize x is thus NR, which corresponds to the number of bits used by the base codebook. The codebook number n is set to 0 and the encoding method terminates. If y is not in the base codebook C, y is considered an outlier and the method 100 proceeds with step 108, which, with steps 110–118, form a Voronoi extension method according to a third embodiment of the first aspect of the present invention.

As discussed hereinbelow, since y is an outlier, more bits are required to quantize x with y compared with the case where y is part of the base codebook. The extension procedure, which is iterative, generates an extended codebook, eventually including a lattice vector y, which can then be indexed properly.

Step 108 is an initialization step, where the extension order r is set to 1 and the scaling factor m to $2^r=2$.

The Voronoi index k is then computed of the lattice point y (step 110) that was the nearest neighbor of vector x in lattice $\Lambda$ obtained in step 102. The Voronoi index k depends on the extension order r and the scaling factor m. The Voronoi index k is computed via the following modulo operations such that it depends only on the relative position of y in a scaled and translated Voronoi region:

$$k = \text{mod}_m(yG^{-1}_\Lambda) \quad \text{(Eq. 10)}$$

where $G_\Lambda$ is the generator matrix of $\Lambda$ and $\text{mod}_m(\bullet)$ is the component wise modulo-m operation. Hence, the Voronoi index k is a vector of integers with each component in the interval 0 to m−1.

In step 112, the Voronoi codevector v is computed from the Voronoi index k given m. This can be implemented, for example, using an algorithm described in Conway (1983)

The computation of v can be done as follows:
1. computing z=k*G (RE8);
2. finding the nearest neighbour w of 1/m.(z−a) in RE8;
3. computing v=z−m*w.

In step 114, the difference vector w=y−v is first computed. This difference vector w always belongs to the scaled lattice m$\Lambda$. Then, c=w/m is computed by applying the inverse scaling to the difference vector w. The codevector c belongs to the lattice $\Lambda$, since w belongs to m $\Lambda$.

It is then verified if c is in the base codebook C (step 116). If c is not in the base codebook C, the extension order r is incremented by 1, the scaling factor m is multiplied by 2 (step 118), and the Voronoi extension proceed with a new iteration (step 110). However, if c is in C, then an extension order r and a scaling factor $m=2^r$ sufficiently large to quantize the source vector x with y without saturation has been found. y is then indexed as a base codevector into j (step 120) as in Lamblin (1988). j and k are multiplexed into an index i (step 122) and the codebook number n is set to the extension order (n=r) in step 124, which terminates the encoding method 100. As it is well known in the art, the multiplexing includes a concatenation of j and k, which means that the bits of j are followed by the bits of k.

The output of the quantization method consists of the codebook number n and the index i of the codevector y. If the Voronoi extension is used, n>0. Otherwise n=0. The index i is:
- the index of y=c in the base codebook, if the Voronoi extension is not used,
- the multiplex of j and k, where j is the index of c in the base codebook C and k is the Voronoi index corresponding to the vector v.

It is to be noted that in Eq. 10 the Voronoi index k is defined as $k=\text{mod}_m(y\ G^{-1}_\Lambda)$, where $m=2^r$. Since y is a lattice point in $\Lambda$, $yG^{-1}_\Lambda$ actually corresponds to the basis expansion of y in $\Lambda$ and consequently is an N-dimensional vector of integers. Therefore k is also a vector of N integers, and due to the component-wise modulo operation $\text{mod}_m$ each component of k is an integer between 0 and m−1. Since $m=2^r$, by construction k requires a total of Nr bits to index all of its N components.

Figure 1:
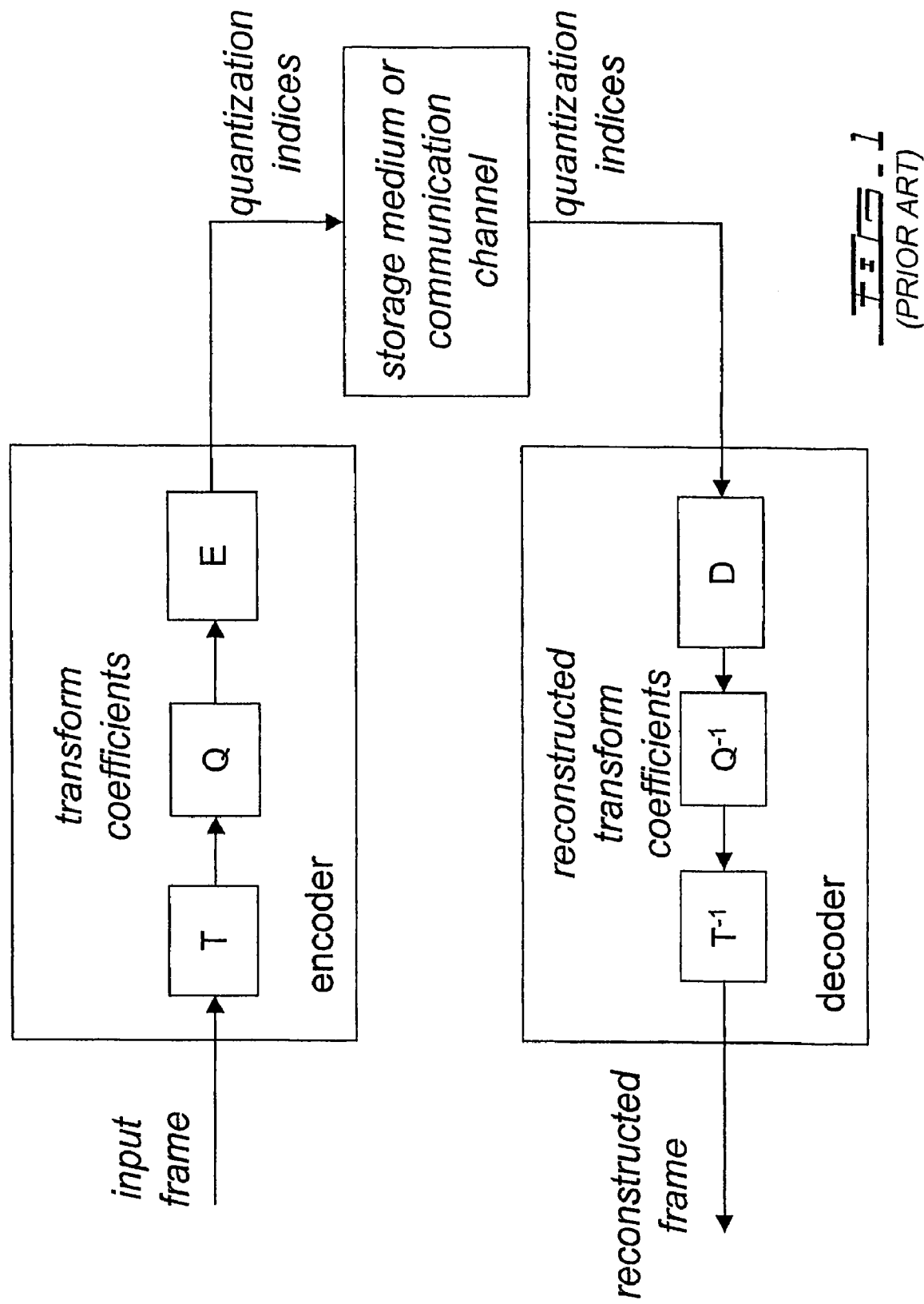
FIG. 1, which is labeled "prior art", is a block diagram illustrating a transform coder according to the prior art.
Figure 2A:
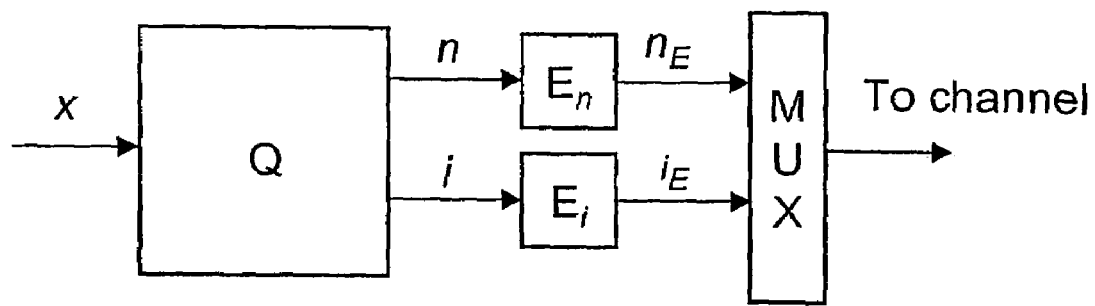
FIGS. 2(a) and 2(b), which are labeled "prior art", are block diagram respectively of the encoder and decoder of a multi-rate quantizer according to a method from the prior art.
Figure 2B:
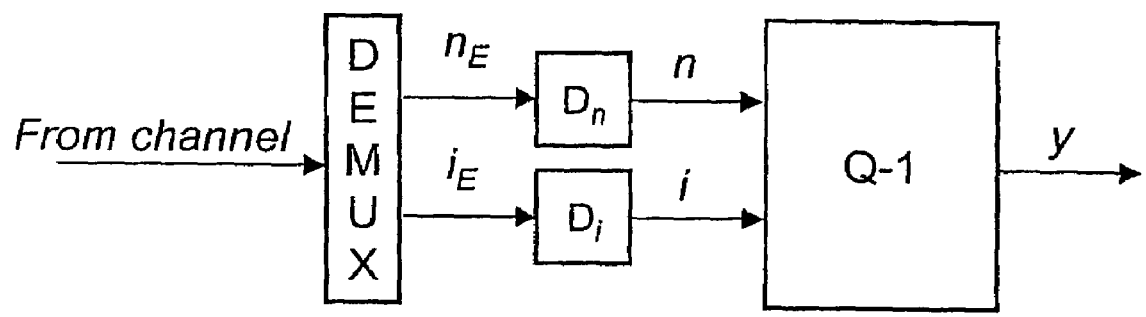
Figure 3:
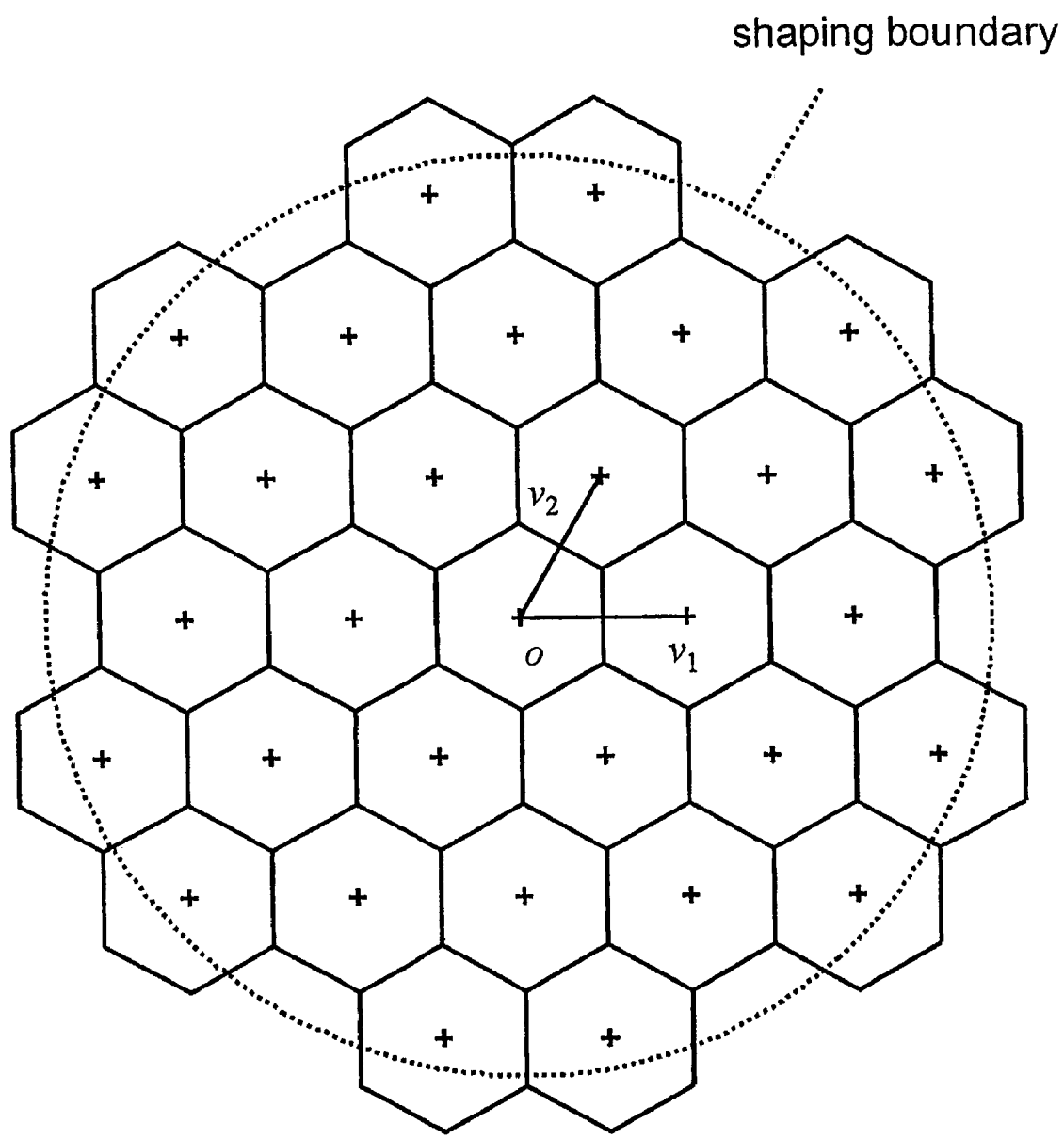
FIG. 3, which is labeled "prior art", is a schematic view illustrating spherical shaping on a two-dimensional hexagonal lattice $A_2$, according to a method from the prior art.
Figure 4:
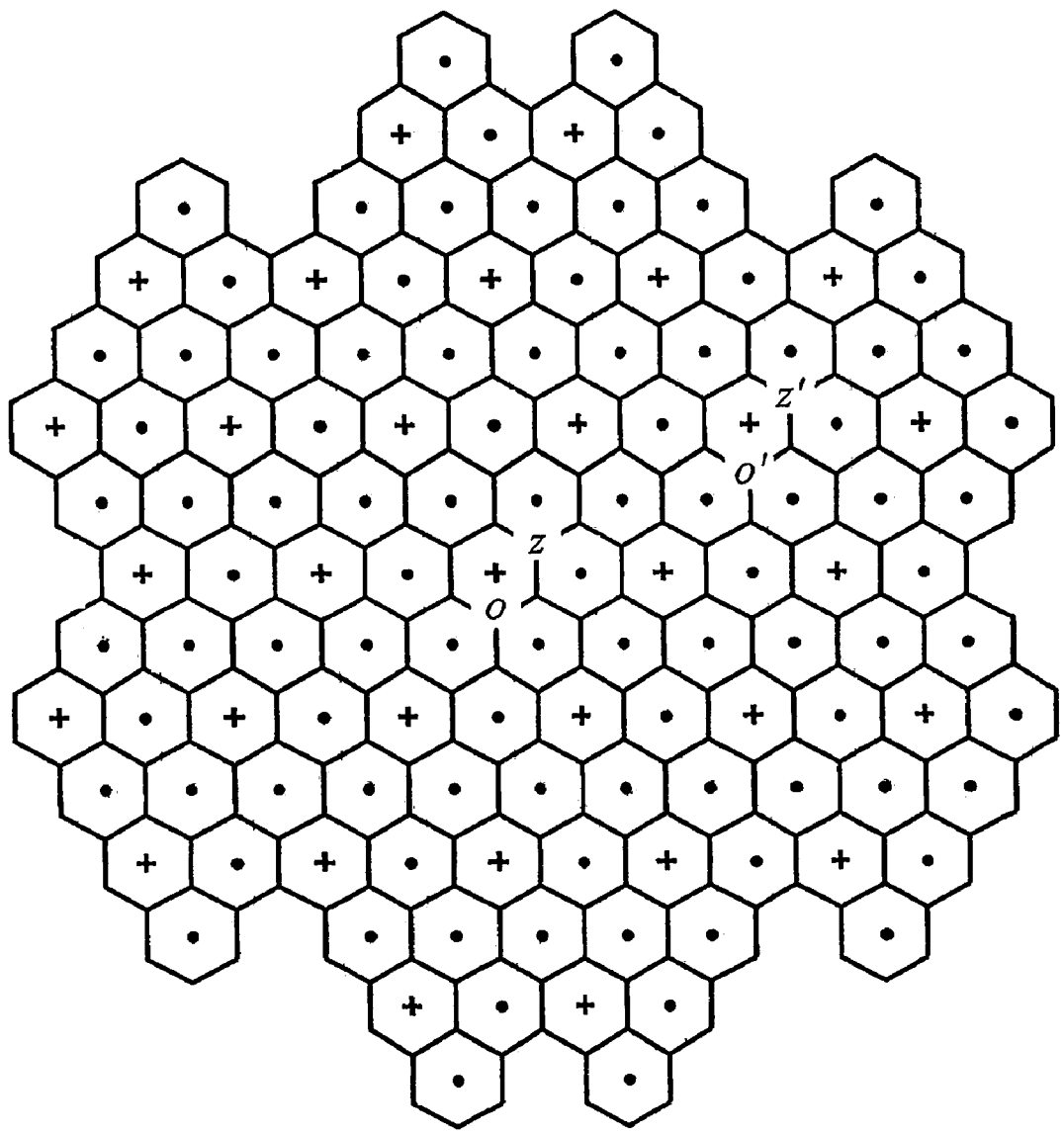
FIG. 4, which is labeled "prior art", is a schematic view illustrating Voronoi coding, Voronoi regions, and tiling of Voronoi regions in a two-dimensional hexagonal lattice $A_2$, according to a method from the prior art.

The quantization method 100 is completed by defining the lossless encoding of the codebook number n and the index i to obtain $n_E$ and $i_E$ to be multiplexed, and stored or transmitted over a communications channel as was illustrated in FIG. 2.

In general, the output of a multi-rate vector quantizer consists of a codebook number n and an index i that may both exhibit statistical redundancy. Without limiting the scope or generality of the present invention, we address here only the entropy coding of the codebook number n to reduce the average bit rate of the quantizer, while no coding is applied to the index i giving $i_E$=i. Any appropriate prior-art lossless coding technique such as arithmetic coding or Huffman coding (Gersho, 1992) may be employed for n. A simple coding method is the unary code, in which a positive integer n is represented in binary form by n−1 ones, followed by zero. This coding scheme will be described hereinbelow in more detail.

Figure 16:
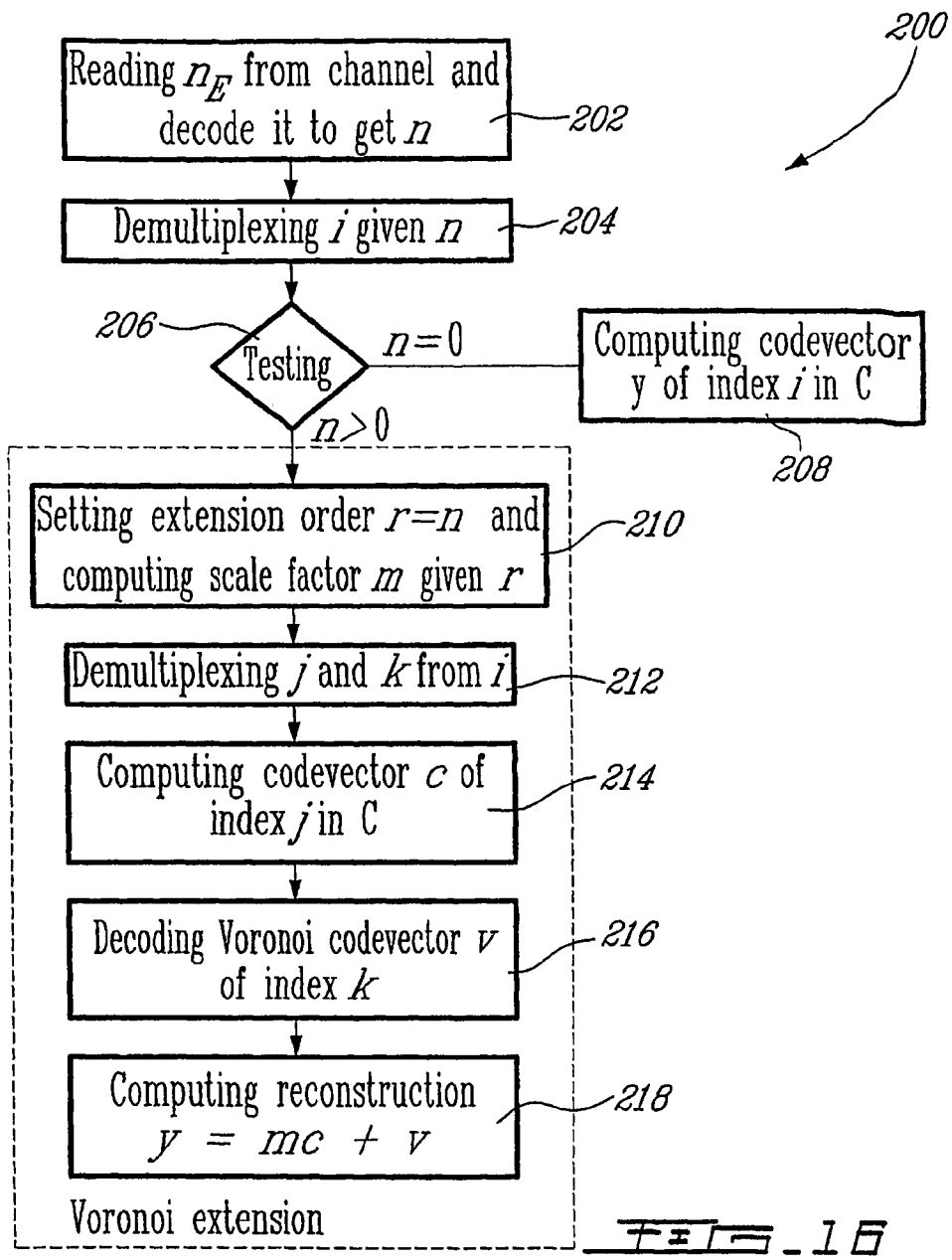
FIG. 16 is a flow chart illustrating a multi-rate lattice quantization decoding method according a first illustrative embodiment of a third aspect of the present invention.

Turning now to FIG. 16 of the appended drawings, a multi-rate lattice quantization decoding method 200 in accordance with an illustrative embodiment of a fourth aspect of the present invention will now be described. The encoded codebook number $n_E$ is first read from the channel and the lossless coding technique used in the method 100 is inverted to get the codebook number n (step 202). It is important to note that n indicates the bit allocation of the multi-rate quantizer and is required to demultiplex the quantization index i in step 204.

If n=0 (step 206), the Voronoi extension is not used. In this case, the index i is decoded to form the codevector c of the base codebook C (step 208) using a prior-art technique such as described in (Lamblin, 1988), (Moureaux, 1998) or (Rault, 2001). The quantized vector is then simply reconstructed as y=c.

If n>0 (step 206), the Voronoi extension is used. The extension order and the scale factor are set to r=n and $m=2^r$ (step 210), respectively. The indices j and k are demultiplexed (step 212). The index j is decoded into c in the base codebook C (step 214), while k is decoded into v in the Voronoi codebook $V^{(r)}$ (step 216). The quantized vector is reconstructed in step 218 as $$y = mc + v \quad \text{(Eq. 11)}$$

It is to be noted that the extension method used in the illustrative embodiment of the present invention is required only if the nearest lattice point y to the vector x to be quantized lies outside the base codebook. Consequently this extension prevents saturation provided the memory (number of available bits) is sufficient. It is important to note that the extended codebook reaches further out in N-dimensional space, while having the same lattice granularity as the base codebook (see for instance FIG. 5). However, more bits are required when the extension is used.

In some instances, the quantizer may run out of bits without being able to capture the source vector x. In other words, the number of bits available to quantize the source vector x may be smaller than the number of bits required for the codevector index i and the codebook number n. In this case, the quantization error is not constrained by the granular structure of the base codebook, but a large error may occur. This typically happens with a very large outlier.

Several strategies can be implemented to handle outliers, such as down scaling the source vector x prior to multi-rate quantization. The scaling factor applied on x can be varied in such a way that there is no bit budget overflow.

For arbitrary outliers x, the complexity of the extension as described previously is unbounded, because the extension always starts with r=0 and increments r by 1 at each iteration, independently of x. However, in practice, the extension order r is limited because of the size allocated to integers on the implementation platform, e.g., 16 for 16-bit unsigned integers. This limitation relates to the maximum value of the components of the Voronoi index k.

It has been found preferable that all lattice points be entries of either the base codebook C or one of its extensions $C^{(r)}$ for r=1, 2, . . . Otherwise, some of the lattice points are impossible to index. For example, a base codebook C designed by near-spherical shaping centered around the origin meets this condition. Also, most of the codebooks obtained by shaping (truncating) a lattice with a centered (convex) region will meet this condition.

Multi-rate lattice quantization encoding and decoding methods according third embodiments of respectively the second and the third aspects of the present invention will now be described.

These third embodiments of the present invention are based on the $RE_8$ lattice discussed hereinabove.

The previous illustrative embodiments of multi-rate quantization encoding and decoding methods according to the invention were based on a single base codebook derived from a lattice Λ that was extended with a bit-rate granularity of 1 bit per dimension. In particular, the extension method used is adapted to extend several near-spherical base codebooks so as to obtain a rate granularity of ½ bit per dimension, 4 bits in dimension 8.

For clarity purposes, the key symbols related to the 8-dimensional multi-rate lattice quantization methods are gathered in Table 2.

TABLE 2

List of symbols related to the 8-dimensional multi-rate lattice quantization method in accordance with the third illustrative embodiment of the invention.

| Symbol | Definition | Note |
|---|---|---|
| $RE_8$ | Gosset lattice in dimension 8. | |
| x | Source vector in dimension 8. | |
| y | Closest lattice point to x in $RE_8$. | The index of y is i. The quantization device outputs y as the quantized vector provided the bit butdget is sufficient. |
| n | Codebook number, restricted to the set {0, 2, 3, 4, 5, . . . }. | |
| $Q_n$ | Lattice codebook in $RE_8$ of index n. There are two categories of codebooks $Q_n$: 1) the base codebooks $Q_0$, $Q_2$, $Q_3$ and $Q_4$, and 2) the extended codebooks $Q_n$ for n > 4. | $Q_n$ is indexed with 4n bits. |
| i | Index of the lattice pointy in a codebook $Q_n$. If the Voronoi extension is used (n > 4), the index i is amultipiex of the indices j and k. The index j corresponds to a lattice point c in $Q_3$ or $Q_4$, while the index k is a Voronoi index. For n ≦ 4, i is an index in a base codebook. | The index i is represented with 4n bits. |
| a | Offset for Voronoi coding, an 8-dimensional vector. | a = [20000000] |
| r | Extension order, a non-negative integer. | |
| m | Scaling factor of the extension. | $m = 2^r$ |
| c | Base codevector in $RE_8$. | |
| j | Index of the base codevector | |

TABLE 2-continued

List of symbols related to the 8-dimensional multi-rate lattice quantization method in accordance with the third illustrative embodiment of the invention.

| Symbol | Definition | Note |
|---|---|---|
| | c. | |
| v | Voronoi codevector in $RE_8$. | The index of v is k. |
| $y_a$ | Absolute leader, $y_a = [y_{a1} \ldots y_{a8}]$. | |
| $k_a$ | Identifier of the absolute leader $y_a$. The base codebooks are specified in terms of absolute leaders (see Table 3). For the absolute leader $y_a$, the identifier $k_a$ can be computed as follows: Compute $s = (y_{a1}^4 + \ldots + y_{a8}^4)/8$. Find the entry s in Table 4 giving $k_a$. | $0 \leq k_a \leq$ the number of absolute leaders |
| k | Index of the Voronoi codevector v or Voronoi index. | See Eq. 10 for a general definition, where $\Lambda = RE_8$ and $G_\Lambda$ as in Eq. 4. |
| s | Key used to compute the identifier $k_a$, $S = (y_{a1}^4 + \ldots + y_{a8}^4)/8$. | See Table 4. |

As will be explained hereinbelow in more detail, the encoding method according to the third illustrative embodiment of the second aspect of the present invention includes taking an 8-dimensional source vector x as an input and outputting an index i and a codebook number n. The codebook number n identifies a specific $RE_8$ codebook denoted by $Q_n$, that is, each $Q_n$ is a subset of the $RE_8$ lattice. The codebook bit rate of $Q_n$ is 4n/8 bits per dimension. The number of bits in the index i is thus 4n. The decoder uses the same multi-rate codebooks $Q_n$ as the encoder, and simply reconstructs the lattice point y from the index i and the codebook number n.

According to the third illustrative embodiment, n is allowed to be any non-negative integer except unity, taking its value in the set {0, 2, 3, 4, 5, 6, . . . }. The case n=1 is not advantageous since it corresponds to a bit allocation of 4 bits in dimension 8. Indeed, at such a low bit rate, lattice quantization is not very efficient, and it is usually better in the context of transform coding to use a noise fill technique instead.

According to this third illustrative embodiment, the multi-rate codebooks are divided into two categories:

Low-rate base codebooks $Q_0$, $Q_2$, $Q_3$ and $Q_4$, which are classical near-spherical lattice codebooks. In the case where the method is implemented in a device, these codebooks are made available using tables stored in a memory or hard-coded In the device. Note that in the illustrative embodiment, the codebooks $Q_2$ and $Q_3$ are embedded, that is, $Q_2$ is a subset of $Q_3$.

Figure 17:
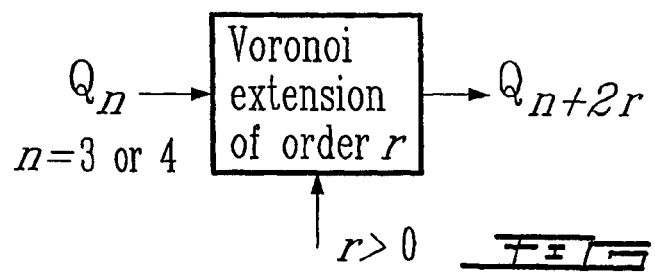
FIG. 17 is a flowchart illustrating the generation of the extended codebooks $Q_5$, $Q_6$, and of other high-rate codebooks according to an aspect of the present invention.

High-rate extended codebooks $Q_n$ for n>4 which are virtually constructed in the device by applying a Voronoi extension method according to the present invention alternately to $Q_3$ and $Q_4$ such that $Q_5$ is generated as the first-order extension of $Q_3$, $Q_6$ is generated as the first-order extension of $Q_4$, $Q_7$ is generated as the second-order extension of $Q_3$, etc. More generally as illustrated in FIG. 17, the extended codebook $Q_{n'}$ for n'=n+2r>4 is generated as the rth order extension of $Q_n$ such that n=3 for odd n' and n=4 for even n'.

The separation between low and high-rate extended codebooks at Q4 allows a compromise between quality (performance) and complexity. For example, setting, for example, the separation at Q5 would yield bigger indexing tables, while setting the separation at Q3 would cause degradation of the quality but reduction of the complexity.

Table 3 defines the mapping of absolute leaders for $Q_0$, $Q_2$, $Q_3$ and $Q_4$. This mapping allows specifying the base codebooks unambiguously. Note that the sign constraints associated to these leaders do not appear in the table, but it is believed to be within the reach of a person having ordinary skills in the art to find them from the properties of $RE_8$ (Lamblin, 1988).

TABLE 3

List of the absolute leaders in $RE_8$ defining the base codebooks $Q_0$, $Q_2$, $Q_3$ and $Q_4$ in accordance with the third illustrative embodiment of a third aspect of the present invention.

| Absolute leader | $Q_0$ | $Q_2$ | $Q_3$ | $Q_4$ |
|---|---|---|---|---|
| 0, 0, 0, 0, 0, 0, 0, 0 | X | | | |
| 1, 1, 1, 1, 1, 1, 1, 1 | | X | X | |
| 2, 2, 0, 0, 0, 0, 0, 0 | | X | X | |
| 2, 2, 2, 2, 0, 0, 0, 0 | | | X | |
| 3, 1, 1, 1, 1, 1, 1, 1 | | | X | |
| 4, 0, 0, 0, 0, 0, 0, 0 | | X | X | |
| 2, 2, 2, 2, 2, 2, 0, 0 | | | | X |
| 3, 3, 1, 1, 1, 1, 1, 1 | | | | X |
| 4, 2, 2, 0, 0, 0, 0, 0 | | | X | |
| 2, 2, 2, 2, 2, 2, 2, 2 | | | | X |
| 3, 3, 3, 1, 1, 1, 1, 1 | | | | X |
| 4, 2, 2, 2, 2, 0, 0, 0 | | | | X |
| 4, 4, 0, 0, 0, 0, 0, 0 | | | X | |
| 5, 1, 1, 1, 1, 1, 1, 1 | | | | X |
| 3, 3, 3, 3, 1, 1, 1, 1 | | | | X |
| 4, 2, 2, 2, 2, 2, 2, 0 | | | | X |
| 4, 4, 2, 2, 0, 0, 0, 0 | | | | X |
| 5, 3, 1, 1, 1, 1, 1, 1 | | | | X |
| 6, 2, 0, 0, 0, 0, 0, 0 | | | X | |
| 4, 4, 4, 0, 0, 0, 0, 0 | | | | X |
| 6, 2, 2, 2, 0, 0, 0, 0 | | | | X |
| 6, 4, 2, 0, 0, 0, 0, 0 | | | | X |
| 7, 1, 1, 1, 1, 1, 1, 1 | | | | X |
| 8, 0, 0, 0, 0, 0, 0, 0 | | | | X |
| 6, 6, 0, 0, 0, 0, 0, 0 | | | | X |
| 8, 2, 2, 0, 0, 0, 0, 0 | | | | X |
| 8, 4, 0, 0, 0, 0, 0, 0 | | | | X |
| 9, 1, 1, 1, 1, 1, 1, 1 | | | | X |
| 10, 2, 0, 0, 0, 0, 0, 0 | | | | X |
| 8, 8, 0, 0, 0, 0, 0, 0 | | | | X |
| 10, 6, 0, 0, 0, 0, 0, 0 | | | | X |
| 12, 0, 0, 0, 0, 0, 0, 0 | | | | X |
| 12, 4, 0, 0, 0, 0, 0, 0 | | | | X |
| 10, 10, 0, 0, 0, 0, 0, 0 | | | | X |
| 14, 2, 0, 0, 0, 0, 0, 0 | | | | X |
| 12, 8, 0, 0, 0, 0, 0, 0 | | | | X |
| 16, 0, 0, 0, 0, 0, 0, 0 | | | | X |

Furthermore, the 8-dimensional offset a defining the Voronoi shaping is set as a=[2 0 0 0 0 0 0 0].

Figure 18:
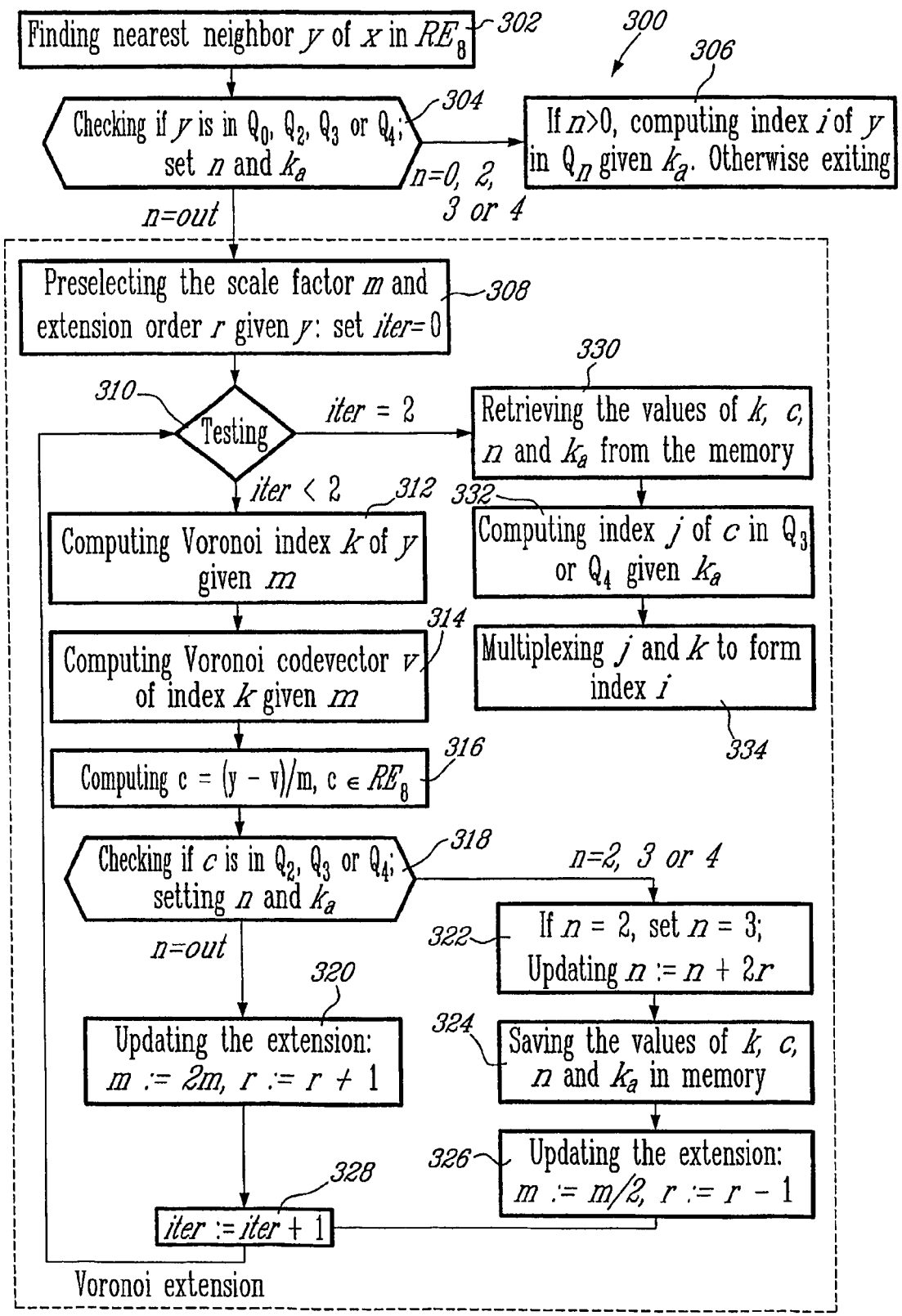
FIG. 18 is a flow chart illustrating a multi-rate lattice quantization encoding method according a second illustrative embodiment of a second aspect of the present invention.

The multi-rate lattice encoding method 300 in accordance with a third embodiment of the second aspect of the invention will now be described in more detail in reference to FIG. 18.

Providing x be a source vector to be quantized in dimension 8. With step 302, the method first proceeds by finding the nearest neighbor y of the 8-dimensional input x in the infinite lattice $RE_8$. Then, in step 304, verification is made as to if y is an entry of a base codebook $Q_0$, $Q_2$, $Q_3$, or $Q_4$. This verification outputs a codebook number n and an identifier $k_a$ if n>0. The details of this verification will be provided hereinbelow. The codebook number n at this stage is taken in the set {0, 2, 3, 4, out}. The value out is an integer set arbitrarily to out=100. The value n=out is used to indicate that an outlier has been detected, meaning that the lattice point y is not an entry in any of the base codebooks. There are then two cases:

- If n≦4 (step 304), the encoding is completed in step 306. If n=0 (step 306), y is the zero vector and encoding is terminated. If n=2, 3, or 4, then extra information $k_a$ identifies one of the absolute leaders defining $Q_n$. The vector y is indexed in $Q_n$ given $k_a$ as will be explained hereinbelow in more detail.
- If n=out (step 304), a Voronoi extension method according to the present invention is applied. The first step (308) of the extension method is to initialize the parameters of the extention, and then to iterate the Voronoi extension algorithm, as described hereinbelow, until y is included in an extended codebook.

In the second embodiment of the multi-rate lattice vector encoding and decoding methods, the Voronoi extension was iterated by incrementing the extension order r until y is reached. This may yield an unbounded complexity. In order to constrain the worst-case complexity, it has been found advantageous to use a maximum of two iterations for the Voronoi extension.

In the initialization step of the extension method, the extension order r and the extension scaling factor m are set to some initial values given the lattice vector $y=[y_1 \ldots y_8]$ so as to minimize the number of iterations over r. The iteration counter iter is set to zero.

The pre-selection of r and m is implemented as follows. First, the floating-point value $\sigma=(y_1^2+ \ldots +y_8^2)/32$ is computed, r=1 is set and $m=2^r=2$. Then while $\sigma>11$, iterate $\sigma$, r, and m by updating $\sigma:=\sigma/4$, $r:=r+1$ and $m:=2m$. The rationale of this procedure is justified by the following two observations:

- When moving from the rth order extension to the (r+1)th extension, the base codebooks $Q_3$ and $Q_4$ are multiplied by $m=2^{r+1}$ instead of $m=2^r$. The squared norm of the scaled base codevectors is multiplied by 4 after the (r+1)th extension compared to the rth extension. This explains the factor ¼ applied to $\sigma$ after each iteration over r.
- The union of the base codebooks $Q_0 \cup Q_2 \cup Q_3 \cup Q_4$ comprises lattice points on the $RE_8$ shells 0 to 32. It can be verified that the outmost complete shell in $Q_0 \cup Q_2 \cup Q_3 \cup Q_4$ is the shell 5. The constant 11 in the termination condition $\sigma>11$ has been selected experimentally between 5 and 32.

An alternative to this initialization procedure consists of computing directly how many times $\sigma$ goes into 11 and then set r and m accordingly. The result will be naturally identical to the iterative procedure described previously.

If iter=2 (step 310), the method exits the loop comprising steps 310–326.

In step 312, the Voronoi index k of the lattice point y is computed given m using modular arithmetic. The Voronoi index k depends on the extension order r and the scaling factor m. In the particular case of the $RE_8$ lattice, the Voronoi index is calculated as follows:

$$k = \text{mod}_m(yG^{-1}_{RE_8})$$

where $G_{RE_8}$ is the generator matrix defined in Eq. 4, and $\text{mod}_m(\bullet)$ is the component wise modulo-m operation. Hence, the Voronoi Index k is a vector of 8 integers, each component being between 0 and m−1. By construction k requires thus a total of 8r bits for indexing all components.

The Voronoi codevector v is computed from the Voronoi index k given m (step 314). The algorithm described in (Conway, 1983) can be used for this purpose.

The difference vector w=y−v is computed (step 316). This difference vector w is a point in the scaled lattice $mRE_8$. c=w/m is then computed (step 316), that is, the inverse scaling is applied to the difference vector w. The point c belongs to the lattice $RE_8$ since w belongs to $mRE_8$.

The extension method proceeds with the verification as to if c is an entry of the base codebooks $Q_2$, $Q_3$ or $Q_4$ (step 318). This verification outputs a codebook number n and also an identifier $k_a$. The details of the verification will be explained hereinbelow in more detail. With the disclosed multi-rate base codebooks, c cannot be in $Q_0$ at this stage. As a result, the actual value of n may be either 2, 3, 4, or out.

If n=out, the extension order r is incremented by one and the extension scale m is multiplied by 2 (step 320).

If c is an entry of $Q_2$, it is also an entry of $Q_3$ because $Q_2$ is embedded in $Q_3$ ($Q_2 \subset Q_3$). Therefore if n=2, n is set to n=3 (step 322). An extension order r and scaling factor $m=2^r$ sufficiently large to quantize the source vector x without saturation occurs when n=3 or n=4. The codebook number n is updated to incorporate the extension order r. This is achieved by adding 2r to n (step 322). c, $k_a$, n and k are then saved into a memory (step 324) and the extension order r is decremented by one and the scaling factor m is divided by 2 (step 326).

The incrementation of the iteration counter iter is incremented by one (step 328), before the beginning of a new iteration (step 310).

When the loop is terminated after two iterations, the parameters characterizing the extension are retrieved from the memory (step 330) that contains the following values:

- The vector c computed in step 316 which is an entry of $Q_3$ or $Q_4$;
- The Voronoi index k computed in step 312. It is to be noted that the Voronoi index k is an 8-dimensional vector, where each component is an integer between 0 and m−1 and can be indexed by r bits;
- The identifier $k_a$ computed as a side product of step 318; and
- The codebook number n incorporating the extension order r as computed in step 320.

The index j of c is computed in step 332. This index is multiplexed with the Voronoi index k to form the index i (step 334). To complete the encoding, the codebook number n Is subjected to lossless encoding as will be described later and multiplexed with the index i for storage or transmission over a channel.

It is to be noted that the encoding method 300 assumes that sufficient memory is available for characterizing the source vector x with a lattice point y. Therefore, the multi-rate quantization encoding method 300 is preferably applied in a gain-shape fashion by down-scaling the source vector x as x/g prior to applying the method 300. The scalar parameter g>1 is determined to avoid an overrun in memory, and quantized separately using prior-art means. However, if the overrun of the memory occurs when failing to choose g properly, by default n is set to zero and the reconstruction y becomes a zero vector. The selection and quantization technique of g is not detailed here since it depends on the actual application.

Furthermore, assuming the method 300 is implemented on a software platform where the components of Voronoi index k are represented with 16-bit integers, the maximum value of r is r=16 resulting in the maximum value n=4+2×16=36 for the codebook number.

The methods for finding the identifier of an absolute leader in base codebooks, and for verifying if a lattice point is in a base codebook (steps 304 and 318) will now be explained in more detail.

According to such a method from the prior art, to verify if a lattice point y is an entry in a near-spherical lattice codebook $Q_2$, $Q_3$ or $Q_4$, the absolute values of the components of y are reordered in descending order and compared directly component by component with the absolute leaders defining the codebooks (see for example Lamblin, 1988). The method according to the present invention is based on the use of the identifier $k_a$. This method is described below in three steps:

1) Computing the value s from y. Writing y component wise as y=[$y_1$ ... $y_8$], this value is computed as $$s=(y_1^4+\ldots+y_8^4)/8 \tag{Eq. 12}$$

2) The values of s computed for the absolute leaders y defining the base codebooks differ all from each other. Moreover, all valid signed permutations of y will result in the same value s. As a consequence, the value s is referred to here as a key, because it identifies uniquely an absolute leader and all the related signed permutations.

3) Setting $k_a$ to value 36 if s=0, y is a zero vector. Otherwise looking-up for the key s in a mapping table translating s into the identifier $k_a$ that may attain integer values between 0 and 37. Table 4 gives this mapping that can readily be computed from Table 3. If the key s is an entry of Table 4, the identifier $k_a$ is an integer between 0 and 36 (see Table 4). Otherwise, y is declared an outlier by setting $k_a$ to 37.

TABLE 4

List of identifiers $k_a$ for the absolute leaders in $RE_8$ defining the base codebooks $Q_2$, $Q_3$ and $Q_4$.

| Identifier $k_a$ | Key in hexadecimal S | Absolute leader |
|---|---|---|
| 0 | 0001 | 1, 1, 1, 1, 1, 1, 1, 1 |
| 1 | 0004 | 2, 2, 0, 0, 0, 0, 0, 0 |
| 2 | 0008 | 2, 2, 2, 2, 0, 0, 0, 0 |
| 3 | 000B | 3, 1, 1, 1, 1, 1, 1, 1 |
| 4 | 0020 | 4, 0, 0, 0, 0, 0, 0, 0 |
| 5 | 000C | 2, 2, 2, 2, 2, 2, 0, 0 |
| 6 | 0015 | 3, 3, 1, 1, 1, 1, 1, 1 |
| 7 | 0024 | 4, 2, 2, 0, 0, 0, 0, 0 |
| 8 | 0010 | 2, 2, 2, 2, 2, 2, 2, 2 |
| 9 | 001F | 3, 3, 3, 1, 1, 1, 1, 1 |
| 10 | 0028 | 4, 2, 2, 2, 0, 0, 0, 0 |
| 11 | 0040 | 4, 4, 0, 0, 0, 0, 0, 0 |
| 12 | 004F | 5, 1, 1, 1, 1, 1, 1, 1 |

TABLE 4-continued

List of identifiers $k_a$ for the absolute leaders in $RE_8$ defining the base codebooks $Q_2$, $Q_3$ and $Q_4$.

| Identifier $k_a$ | Key in hexadecimal S | Absolute leader |
|---|---|---|
| 13 | 0029 | 3, 3, 3, 3, 1, 1, 1, 1 |
| 14 | 002C | 4, 2, 2, 2, 2, 2, 2, 0 |
| 15 | 0044 | 4, 4, 2, 2, 0, 0, 0, 0 |
| 16 | 0059 | 5, 3, 1, 1, 1, 1, 1, 1 |
| 17 | 00A4 | 6, 2, 0, 0, 0, 0, 0, 0 |
| 18 | 0060 | 4, 4, 4, 0, 0, 0, 0, 0 |
| 19 | 00A8 | 6, 2, 2, 2, 0, 0, 0, 0 |
| 20 | 00C4 | 6, 4, 2, 0, 0, 0, 0, 0 |
| 21 | 012D | 7, 1, 1, 1, 1, 1, 1, 1 |
| 22 | 0200 | 8, 0, 0, 0, 0, 0, 0, 0 |
| 23 | 0144 | 6, 6, 0, 0, 0, 0, 0, 0 |
| 24 | 0204 | 8, 2, 2, 0, 0, 0, 0, 0 |
| 25 | 0220 | 8, 4, 0, 0, 0, 0, 0, 0 |
| 26 | 0335 | 9, 1, 1, 1, 1, 1, 1, 1 |
| 27 | 04E4 | 10, 2, 0, 0, 0, 0, 0, 0 |
| 28 | 0400 | 8, 8, 0, 0, 0, 0, 0, 0 |
| 29 | 0584 | 10, 6, 0, 0, 0, 0, 0, 0 |
| 30 | 0A20 | 12, 0, 0, 0, 0, 0, 0, 0 |
| 31 | 0A40 | 12, 4, 0, 0, 0, 0, 0, 0 |
| 32 | 09C4 | 10, 10, 0, 0, 0, 0, 0, 0 |
| 33 | 12C4 | 14, 2, 0, 0, 0, 0, 0, 0 |
| 34 | 0C20 | 12, 8, 0, 0, 0, 0, 0, 0 |
| 35 | 2000 | 16, 0, 0, 0, 0, 0, 0, 0 |

It is to be noted that the last column on the right in table 4 is only informative and defines without ambiguity the mapping between the identifier $k_a$ and the related absolute leader.

At this stage, the identifier verifies $0 \leq k_a \leq 37$. Indeed, if $0 \leq k_a 36$, y is either in $Q_2$, $Q_3$ or $Q_4$. If $k_a=36$, y is in $Q_0$. If $k_a=37$, y is not in any of the base codebooks. The identifier $k_a$ is then mapped to the codebook number n with Table 5.

TABLE 5

Mapping table to translate the identifier $k_a$ of absolute leaders into a base codebook number n in accordance with the present invention.

| Identifier $k_a$ | Codebook number n |
|---|---|
| 0 | 2 |
| 1 | 2 |
| 2 | 3 |
| 3 | 3 |
| 4 | 2 |
| 5 | 4 |
| 6 | 4 |
| 7 | 3 |
| 8 | 4 |
| 9 | 4 |
| 10 | 4 |
| 11 | 3 |
| 12 | 4 |
| 13 | 4 |
| 14 | 4 |
| 15 | 4 |
| 16 | 4 |
| 17 | 3 |
| 18 | 4 |
| 19 | 4 |
| 20 | 4 |
| 21 | 4 |
| 22 | 3 |
| 23 | 4 |
| 24 | 4 |
| 25 | 4 |
| 26 | 4 |
| 27 | 4 |

TABLE 5-continued

Mapping table to translate the identifier $k_a$ of absolute leaders into a base codebook number n in accordance with the present invention.

| Identifier $k_a$ | Codebook number n |
|---|---|
| 28 | 4 |
| 29 | 4 |
| 30 | 4 |
| 31 | 4 |
| 32 | 4 |
| 33 | 4 |
| 34 | 4 |
| 35 | 4 |
| 36 | 0 |
| 37 | out = 100 |

The method for indexing in base codebooks $Q_2$, $Q_3$, and $Q_4$ based on the identifier of the absolute leader (steps 306 and 332) will now be described in more detail.

The index of an entry y in the base codebooks $Q_2$, $Q_3$, and $Q_4$ is computed using a prior-art indexing technique for near-spherical codebooks as described in Lamblin (1988). To be more precise, the index of y, for example j, is computed as follows: j=cardinality offset+rank of permutation. The rank of permutation is computed according to Schalkwijk's formula, which is well known in the art and described in (Lamblin, 1988). The cardinality offset is found by table look-up after computing the signed leader for y. This table look-up is based on the identifier $k_a$ of the related absolute leader.

According to the illustrative embodiments of the invention, the codebook number n is encoded using a variable-length binary code, well-known in the prior art as a unary code, based on the following mapping:

$Q_0 \rightarrow 0$
$Q_2 \rightarrow 10$
$Q_3 \rightarrow 110$
$Q_4 \rightarrow 1110$
$Q_5 \rightarrow 11110$ The right hand side of the above mapping gives $n_E$ in binary representation to be multiplexed with the codevector index i. Further, when the Voronoi extension is used (when n>4), the codevector index i comprises two sub-indices multiplexed together:

the base codebook index j of 12 bits for odd n and 16 bits for even n; and the Voronoi index k of 8r bits, comprising eight integers of r bits as its components.

The structure of i is illustrated in FIG. 19(*a*) for $2 \leq n \leq 4$, while FIG. 19(*b*) considers the case n>4. It is to be note that the multiplexed bits may be permuted in any fashion within the whole block of 4n bits.

Figure 20:
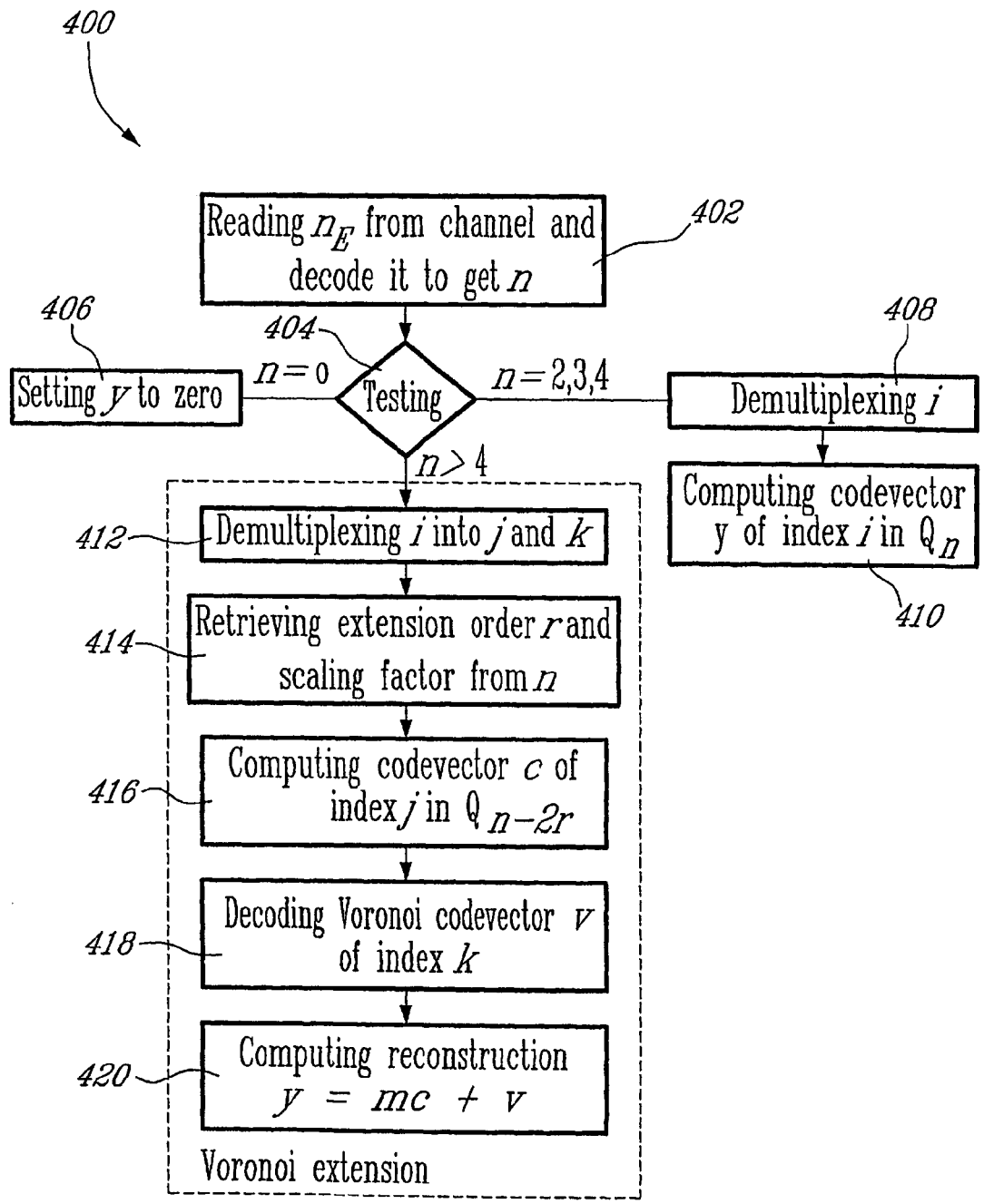
FIG. 20 is a flow chart illustrating a multi-rate lattice quantization decoding method according a second illustrative embodiment of a third aspect of the present invention.

The multi-rate lattice decoding method 400 in accordance with a third embodiment of the third aspect of the invention will now be described in more detail in reference to FIG. 20.

The coded codebook number $n_E$ is first read from the channel and decoded to get the codebook number n (step 402). The codebook number n is retrieved from $n_E$ by reversing the mapping described in the method 300. Then the decoder interprets the codevector index i differently depending on the codebook number n.

If n=0 (step 404), y is reconstructed as a zero vector that is the only entry of the base codebook $Q_0$ (step 406).

If $0<n \leq 4$ (step 404), the codevector index i of size 4n bits from the channel is demultiplexed (step 408). Then i is decoded as an index of a base codebook $Q_2$, $Q_3$, or $Q_4$ and y is reconstructed using prior-art techniques (step 410) such as those described in Lamblin (1988), Moureaux (1998) and Rault (2001).

A value n>4 in step 404 indicates that the Voronoi extension is employed. The codevector index i of size 4n bits from the channel (step 408) is demultiplexed as the base codebook index j and the Voronoi index k from i (step 412). The extension order r is also retrieved and so is scaling factor m from n (step 414). The value of r is obtained as a quotient of (n−3)/2, and m=$2^r$. Then 2r is substracted from n to identify either $Q_3$ or $Q_4$, and the index j is decoded into c using the subtracted value of n (step 416). The decoding of j is based on a prior-art method comprising of rank decoding and table look-ups as described in Lamblin (1988), Moureaux (1998) and Rault (2001). The Voronoi index k is decoded into v (step 418) based on m using the prior-art algorithm described in (Conway, 1983). Finally, in step 420, the decoder computes the reconstruction as y=m c+v, where m=$2^r$ is the extension scaling factor, c is a codevector of the base codebook and v is a codevector of the Voronoi codebook. When r=0, no extension is used, and v is a zero vector and m becomes one.

Although the present invention has been described hereinabove by way of illustrative embodiments thereof, it can be modified without departing from the spirit and nature of the subject invention, as defined in the appended claims.

What is claimed is:

1. A multi-rate lattice quantization encoding method comprising:
   i) providing a source vector x representing a frame from a source signal;
   ii) providing a base codebook C derived from a lattice Λ;
   iii) associating to x a lattice point y in said lattice Λ;
   iv) if y is included in said base codebook C then indexing y in said base codebook C yielding quantization indices, and ending the method, if not then
   v) extending said base codebook, yielding an extended codebook;
   vi) associating to y a codevector c from said extended codebook; and
   vii) indexing y in said extended codebook yielding quantization indices.

2. A method as recited in claim 1, wherein said extended codebook is represented by the expression mC+V, wherein C is said base codebook, V is an appropriate set of points in said lattice Λ.

3. A method as recited in claim 1, wherein in iii) said lattice point y in said lattice Λ is selected as the nearest neighbor of x in said lattice Λ.

4. A method as recited in claim 1, wherein step v) includes providing an integer scaling factor m>=2; step vi) includes computing a Voronoi codevector v corresponding to lattice point y using m and providing an offset; and vi) includes computing said codevector c using v and m.

5. A method as recited in claim 4, wherein in step v) said scaling factor m is set to $2^r$ and step v) further includes computing a Voronoi index k; step vi) includes computing a Voronoi codevector v corresponding to said lattice point y using k and m.

6. A method as recited in claim 4, wherein in vi) said codevector c is computed as c=(y−v)/m, wherein m is an integer greater than or equal to 2.

7. A method as recited in claim 4, wherein step vi) further includes verifying if c is in said base codebook C, then
   a) step vii) further includes indexing y as a base codevector and multiplexing j and k yielding quantization indices, where j is the index of c in the base codebook C and k is the Voronoi index corresponding to the vector v; if not then
   b) b) increasing said scale factor and said order of said Vorenoi extension and repeating steps v) to vi).

8. A method as recited in claim 4, further comprising in vii) defining the lossless encoding of the codebook number corresponding to said extension order r and the index i of the codevector y in said base codebook, yielding an encoded codebook number $n_E$ and an encoded index $i_E$; and multiplexing $n_E$ and $i_E$.

9. A method as recited in claim 1, further comprising:
   vii) storing said said quantization indices in storing means.

10. A method as recited in claim 1, further comprising:
    vii) transmitting said said quantization indices over a communication channel.

11. A multi-rate lattice quantization encoding method comprising:
    providing a source vector x representing a frame from a source signal;
    providing finite subsets C and V of an infinite lattice L of points;
    associating x with y, y being one of said points in said lattice L; and
    indexing y into an integer codebook number n and an index i as y=mc+v, wherein c is an element of C, v is an element of V, and m is an integer greater than or equal to two;
    wherein said subsets C and V of the lattice L, the value of m and the size of i being uniquely defined from n.

12. A method as recited in claim 11, wherein n is represented by a unary code.

13. A method as recited in claim 11, wherein said subset V of an infinite lattice L is a Voronoi codebook and said index of v is a Voronoi index.

14. A method as recited in claim 11, wherein said index i is the concatenation of an index of c and an index of v.

15. A method as recited in claim 11, wherein y=[0 . . . 0] and n is set to a predetermined value when a number of allocated bits available in implementing the method is not sufficient to represent said source vector x in said infinite lattice L.

16. A method as recited in claim 11, wherein $m=2^r$; said subset C being predetermined; said codebook number n being equal to r plus a predetermined integer; r being an integer greater than or equal to 1.

17. A multi-rate lattice quantization encoding method comprising:
    i) providing an 8-dimension source vector x representing a frame from a source signal;
    ii) providing low-rate lattice base codebooks $Q_0$, $Q_2$, $Q_3$, and $Q_4$ derived from a $RE_8$ lattice;
    iii) determining a lattice point y in said lattice $RE_8$ which is the nearest neighbor of x in said lattice $RE_8$;
    iv) if y is included in $Q_z$, where z equals 0, 2, 3, or 4 then
       a) memorizing the number z and an identifier $k_a$ identifying one of absolute leaders defining $Q_z$, b) if z>0 then b1) indexing y in $Q_z$ yielding quantization indices, if m=0 then b2) y is outputted as a zero vector, and c) ending the method;
    v) providing an extension order r, and setting a scaling factor m to $2^r$;
    vi) setting an iteration number iter=0;
    vii) computing a Voronoi index k of the lattice point y;
    viii) computing a Voronoi code vector v corresponding to said lattice point y using k and m;
    ix) computing a codevector c as c=(y−v)/m;
    x) if c is included in $Q_z$, wherein z equals 2, 3, or 4, then
       aa) providing z and $k_a$; if n=2, setting n=3; incrementing n by 2r; storing the values of k, c, z, and $k_a$; dividing m by 2; decreasing r from 1; if not, then
       bb) multiplying m by 2; increasing r by 1;
    xi) increasing said iteration number by 1;
    xii) if said iteration number=2 then aaa) retrieving said values of k, c, z, and $k_a$; indexing j of c in $Q_3$ or in $Q_4$, given $k_a$; multiplexing j and k to form index i, where l is the index of the codevector y and j is the index of c; if not then bbb) repeating steps vii) to xii).

18. A method as recited in claim 17, wherein in vii) k is computed as being:

$$k = \mathrm{mod}_m(yG^{-1}_{RE_8})$$

where $G_{RE_8}$ is a generator matrix defined as $$G_{RE_8} = \begin{bmatrix} 4 & 0 & 0 & 0 & 0 & 0 & 0 & 0 \\ 2 & 2 & 0 & 0 & 0 & 0 & 0 & 0 \\ 2 & 0 & 2 & 0 & 0 & 0 & 0 & 0 \\ 2 & 0 & 0 & 2 & 0 & 0 & 0 & 0 \\ 2 & 0 & 0 & 0 & 2 & 0 & 0 & 0 \\ 2 & 0 & 0 & 0 & 0 & 2 & 0 & 0 \\ 2 & 0 & 0 & 0 & 0 & 0 & 2 & 0 \\ 1 & 1 & 1 & 1 & 1 & 1 & 1 & 1 \end{bmatrix} = \begin{bmatrix} v_1 \\ v_2 \\ v_3 \\ v_4 \\ v_5 \\ v_6 \\ v_7 \\ v_8 \end{bmatrix}$$

and $\mathrm{mod}_m(\bullet)$ is the component wise modulo-m operation.

19. A method as recited in claim 17, further comprising down-scaling said source vector x as x/g prior to step iii); g being chosen so as to be greater then 1 and as to avoid an overrun in a memory used in implementing the method.

20. A multi-rate lattice quantization decoding method comprising:
    i) providing a base codebook C derived from a lattice Λ;
    ii) providing a codebook number n and a quantization index i;
    iii) demultiplexing said quantization index i using said codebook number n;
    iv) if n=0 then decoding said index i using said base codebook, yielding a quarterized vector y, and ending the method;
    v) if n>0 then
       a) providing a preselected Voronoi codebook $V^{(r)}$;
       b) setting an extension order to r=n and a scale factor $m=2^r$;
       c) demultiplexing indices j and k from i;
       d) decoding j into c in said base codebook C;
       e) decoding k into v in said Voronoi codebook $V^{(r)}$; and
       f) reconstructing a quantized vector as $$y = mc + v.$$

21. A method as recited in claim 20, wherein in ii) an encoded codebook number $n_E$ and an encoded index $i_E$ are first provided; then a predetermined lossless coding technique is applied on said encoded codebook number $n_E$ to get said codebook number n and said quantization index i.

22. A decoding method as recited in claim 20, wherein said codebook number n and said index i are read from a communication channel.

23. A decoding method as recited in claim 20, wherein said codebook number n and said index i are read from storing means.

24. A method as recited in claim 20, wherein n is reconstructed from a unary code.

25. A method as recited in claim 20, wherein said subset V of L is a Voronoi code and said index of v is a Voronoi index.

26. A multi-rate lattice quantization decoding method comprising:
  providing finite subsets C and V of an infinite lattice L of points;
  providing a codebook number n and an index i;
  using n and i to reconstruct a vector y in a lattice L as y=mc+v, where m is an integer greater than or equal to two, and c and v are points included in L; said point c being reconstructed as an element of a finite subset C of L; said point v is reconstructed as an element of a finite subset V of L; indices of v and of c being computed using i;
  wherein said subsets C and V of the lattice L, the value of m and the size of i being uniquely defined from n.

27. A multi-rate lattice quantization decoding method comprising:
  providing low-rate lattice base codebooks $Q_0$, $Q_2$, $Q_3$, and $Q_4$ derived from a $RE_8$ lattice;
  providing a codebook number n and an index i;
  if n=0, then reconstructing y as a zero vector;
  if $0<n\leq 4$, then demultiplexing a codevector index i, decoding i as an index of a base codebook $Q_2$, $Q_3$, or $Q_4$ and reconstructing y;
  if n>4 then demultiplexing said codevector index i as a base codebook index j and a Voronoi index k from i; providing an extension order r and a scaling factor m from n; using n to identify either $Q_3$ or $Q_4$, and decoding said index j; computing y=m c+v, where $m=2^r$ is an extension scaling factor, c is a codevector of said base codebook and v is a codevector of a Voronoi codebook.

28. A method for lattice vector quantization of a source vector x comprising:
  i) providing a subset of vectors from a lattice of vectors of dimension N, yielding a base codebook requiring NR bits for indexing, where R is the bit rate per dimension of said base codebook;
  ii) determining the nearest vector y of x in said lattice of vectors;
  iii) if said nearest vector y is comprised within said base codebook then indexing y in said base codebook yielding quantization indices, outputting said quantization indices, and ending the method; if not then:
  iv) providing a predetermined scale factor;
  v) scaling said base codebook by said scale factor, yielding a scaled codebook including scaled covectors;
  vi) inserting a Voronoi codebook around each said scaled codevectors, yielding an extended codebook requiring N(R+r) bits for indexing, where r is the order of said Vorenoi codebook; and
  vii) if said nearest neighbour y is comprised within said extended codebook then indexing y in said extended codebook yielding quantization indices, outputting said quantization indices, and ending the method; if not then
  viii) if the number of bits required for indexing said extended codebook has not exceeded a predetermined threshold then increasing said scale factor and said order of said Vorenoi codebook and repeating steps v) to viii); if not then said nearest neighbor is considered a remote outlier and outputting predetermined corresponding quantization indices.

29. A method as recited in claim 28, wherein in step iv) said predetermined scale factor is 2, and in step viii) said scale factor is increased by 2.

30. A method as recited in claim 28, wherein in step viii) said order of said Voronoi codebook is increased by 1.

31. A multi-rate lattice quantization encoder comprising:
  receiving means for providing a source vector x representing a frame from a source signal;
  memory means including a base codebook C derived from a lattice $\Lambda$;
  means associating to x a lattice point y in said lattice $\Lambda$;
  means for verifying if y is included in said base codebook C and for indexing y in said base codebook C yielding quantization indices;
  means for extending said base codebook and for yielding an extended codebook;
  means for associating to y a codevector c from said extended codebook; and
  means for indexing y in said extended codebook C and for yielding quantization indices.

32. A multi-rate lattice quantization encoder comprising:
  means for receiving a source vector x representing a frame from a source signal;
  means for providing finite subsets C and V of an infinite lattice L of points;
  means for associating x with y, one of said points in said lattice L;
  means for indexing y into an integer codebook number n and an index i as y=mc+v, wherein c is an element of C, v is an element of V, and m is an integer greater than or equal to two; wherein said subsets C and V of the lattice L, the value of m and the size of i being uniquely defined from n.

33. A multi-rate lattice quantization decoder comprising:
  memory means for providing a base codebook C derived from a lattice $\Lambda$;
  receiving means for providing an encoded codebook number n and an encoded index i;
  means for demultiplexing said quantization index i using said codebook number n;
  means for verifying if n=0, and a) for decoding said index i using said base codebook, yielding a quantized vector y;
  means for verifying if n>0;
  means for providing a preselected Voronoi codebook $V^{(r)}$;
  means for setting an extension order to r=n and a scale factor $m=2^r$;
  means for demultiplexing indices j and k from i;
  means for decoding j into c in said base codebook C;
  means for decoding k into v in said Voronoi codebook $V^{(r)}$; and
  means for reconstructing a quantized vector as y=m c+v.

34. A multi-rate lattice quantization decoder:
  memory means for providing finite subsets C and V of an infinite lattice L of points;

receiving means for providing a codebook number n and an index i;

means for using n and i to reconstruct a vector y in a lattice L as y=mc+v, where m is an integer greater than or equal to two, and c and v are points included in L; said point c being reconstructed as an element of a finite subset C of L; said point v is reconstructed as an element of a finite subset V of L; indices of v and of c being computed using i; wherein said subsets C and V of the lattice L, the value of m and the size of i being uniquely defined from n.

* * * * *

UNITED STATES PATENT AND TRADEMARK OFFICE
CERTIFICATE OF CORRECTION

| | |
|---|---|
| PATENT NO. | : 7,106,228 B2 |
| APPLICATION NO. | : 10/515550 |
| DATED | : September 12, 2006 |
| INVENTOR(S) | : Bessette et al. |

Page 1 of 1

It is certified that error appears in the above-identified patent and that said Letters Patent is hereby corrected as shown below:

Col. 26, claim 20, line 9, the word reading "quarterized" should read --quantized--.

Signed and Sealed this

Twelfth Day of December, 2006

JON W. DUDAS
*Director of the United States Patent and Trademark Office*